US007360190B1

(12) United States Patent
Singh et al.

(10) Patent No.: US 7,360,190 B1
(45) Date of Patent: Apr. 15, 2008

(54) METHOD AND APPARATUS FOR PERFORMING RETIMING ON FIELD PROGRAMMABLE GATE ARRAYS

(75) Inventors: Deshanand Singh, Toronto (CA); Gabriel Quan, Toronto (CA); Terry Borer, Toronto (CA); Ian Chesal, Toronto (CA); Valavan Manohararajah, Scarborough (CA); Karl Schabas, Toronto (CA); Stephen Brown, Toronto (CA)

(73) Assignee: Altera Corporation, San Jose, CA (US)

( * ) Notice: Subject to any disclaimer, the term of this patent is extended or adjusted under 35 U.S.C. 154(b) by 100 days.

(21) Appl. No.: 10/876,709

(22) Filed: Jun. 25, 2004

Related U.S. Application Data

(63) Continuation-in-part of application No. 10/617,502, filed on Jul. 11, 2003.

(51) Int. Cl.
G06F 17/50 (2006.01)
G06F 9/45 (2006.01)
(52) U.S. Cl. .......................... 716/6; 716/18
(58) Field of Classification Search .............. 716/1–14, 716/18, 17; 326/39, 38; 713/1
See application file for complete search history.

(56) References Cited

U.S. PATENT DOCUMENTS 6,099,583 A * 8/2000 Nag ............................. 716/16
6,130,551 A * 10/2000 Agrawal et al. ............. 326/39
6,480,954 B2 * 11/2002 Trimberger et al. ........... 713/1
6,631,508 B1 * 10/2003 Williams ........................ 716/8
7,019,557 B2 * 3/2006 Madurawe ................... 326/38
7,120,883 B1 * 10/2006 van Antwerpen et al. ...... 716/6
2004/0243964 A1 * 12/2004 McElvain et al. ............ 716/12

OTHER PUBLICATIONS

K. Eckl et al., A Practical Approach to Multiple-Class Retiming, Proceedings of the 36th Design Automation Conference, pp. 237-242, Jun. 1999.*
D. Singh et al., Incremental Retiming for FPGA Physical Synthesis, Proceedings of the 42nd Design Automation Conference, pp. 433-438, Jun. 2005.*
J. Lee et al., FPGA Mapping of Sequential Circuits with Retiming, Proceedings of the 1998 IEEE International Symposium on Circuits and Systems, pp. 426-429, May-Jun. 1998.*
M.E. Dehkordi et al., Retiming Aware Clustering for Sequential Circuits, Proceedings of the 2004 IEEE International Conference on Field-Programmable Technology, pp. 391-394, 2004.*
R. Fischer et al., Reducing the Power Consumption of FPGA s through Retiming, 12th IEEE International Conference and Workshops on the Engineering of Computer-Based Systems, pp. 89-94, Apr. 2005.*
Singh et al., Integrated Retiming and Placement for Field Programmable Gate Arrays, Feb. 2002, IEEE/ACM, pp. 67-76.*
Singh et al., Incremental Placement for Layout-Driven Optimizations on FPGAs, Nov. 2002, IEEE/ACM, pp. 752-759.*

* cited by examiner

*Primary Examiner*—Jack Chiang
*Assistant Examiner*—Nghia M. Doan
(74) *Attorney, Agent, or Firm*—L. Cho

(57) ABSTRACT

A method for designing a system on a target device utilizing field programmable gate arrays (FPGAs) includes identifying registers on near-critical paths. The registers are moved to shorten lengths of one or more near-critical paths.

31 Claims, 20 Drawing Sheets

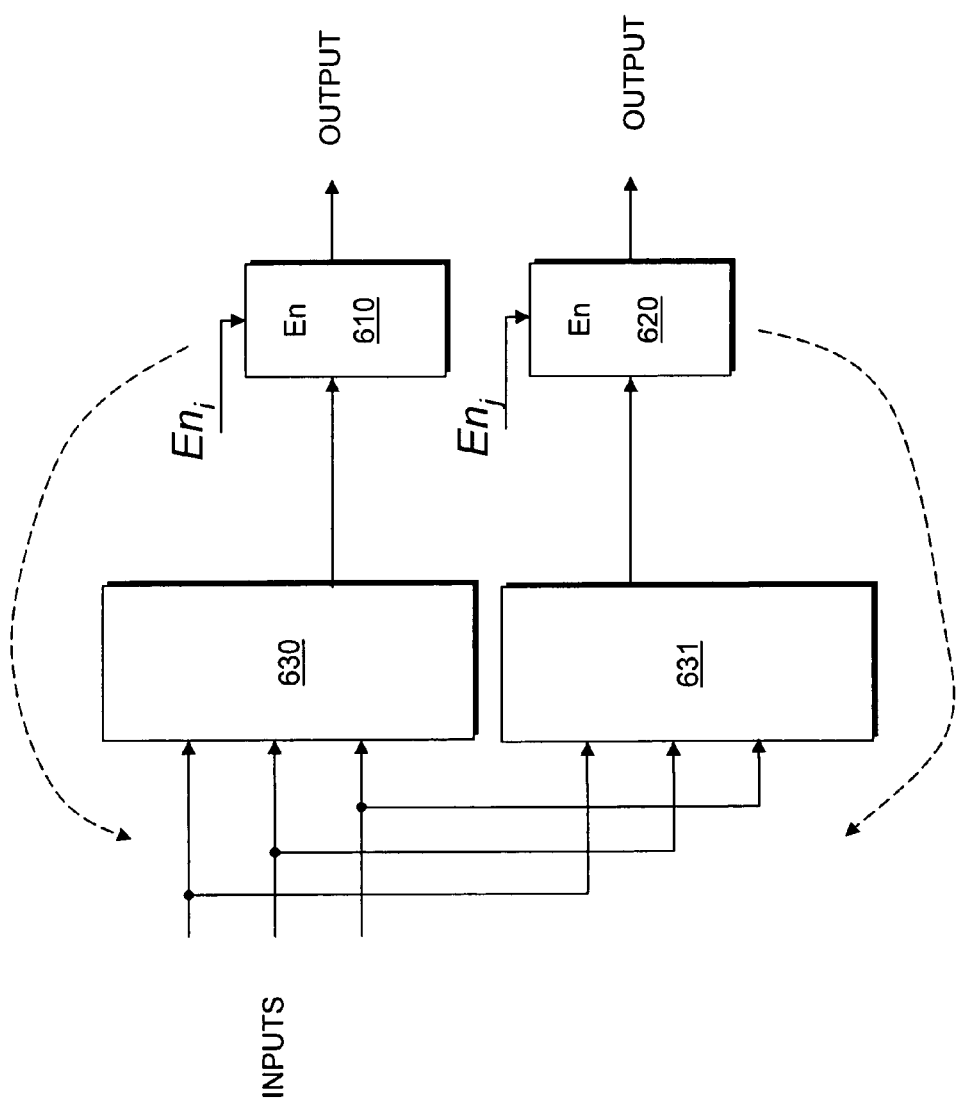

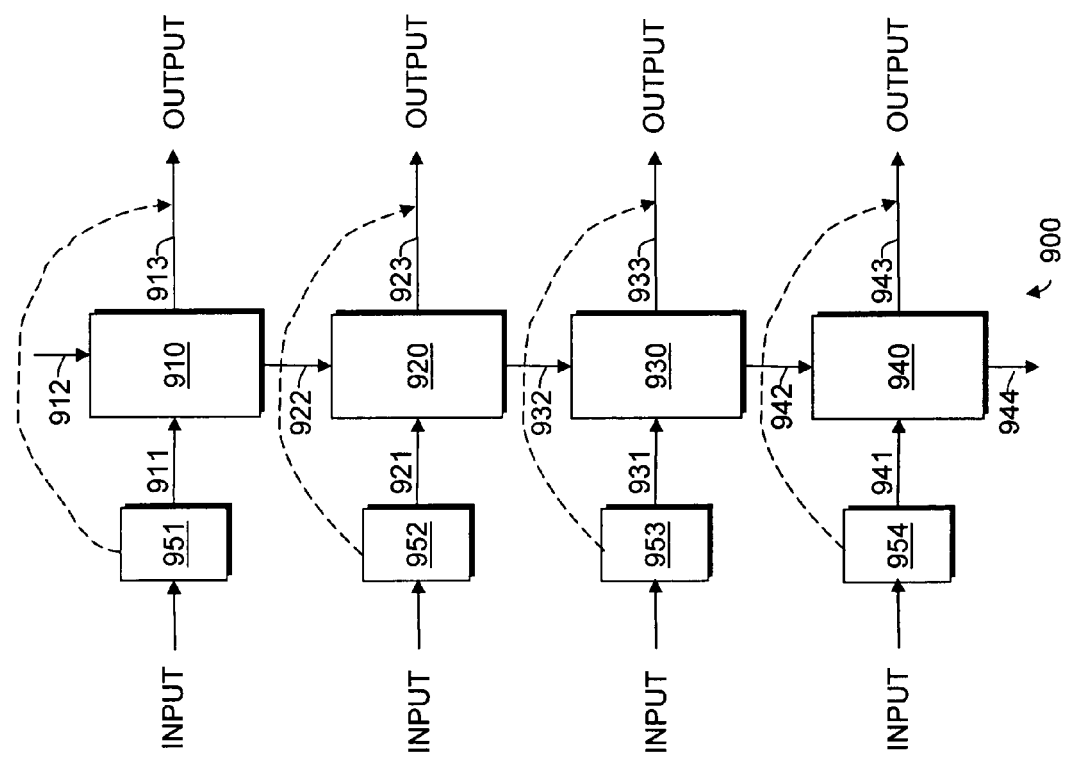

US 7,360,190 B1

METHOD AND APPARATUS FOR PERFORMING RETIMING ON FIELD PROGRAMMABLE GATE ARRAYS

RELATED APPLICATION

This application is a continuation-in-part of, and claims the benefit under Title 35, United States Code, Section 120 of co-pending U.S. application Ser. No. 10/617,502 filed on Jul. 11, 2003 and entitled "METHOD AND APPARATUS FOR PERFORMING INCREMENTAL PLACEMENT FOR LAYOUT-DRIVEN OPTIMIZATIONS ON FIELD PROGRAMMABLE GATE ARRAYS".

TECHNICAL FIELD

The present invention relates to the field of field programmable gate arrays (FPGAs). More specifically, the present invention relates to a method and apparatus for performing retiming on systems on FPGAs using tools such as electronic design automation (EDA) tools.

BACKGROUND

FPGAs may be used to implement large systems that include millions of gates and megabits of embedded memory. Of the tasks required in managing and optimizing a design, placement of components on the FPGAs and routing connections between components on the FPGA utilizing available resources can be the most challenging and time consuming. In order to satisfy placement and timing specifications, several iterations are often required to determine how components are to be placed on the target device and which routing resources to allocate to the components. The complexity of large systems often requires the use of EDA tools to manage and optimize their design onto physical target devices. Automated placement and routing algorithms in EDA tools perform the time consuming task of placement and routing of components onto physical devices.

Retiming is a synchronous circuit transformation that can optimize the speed-performance of a synchronous circuit. Retiming involves moving registers across combinational circuit elements in order to reduce the length of timing-critical paths. The combinational structure remains unchanged and the observable behavior of the circuit is identical to the original circuit. Retiming, however, has not been extensively used in commercial synthesis tools because it is difficult to generalize current retiming algorithms to handle complex issues such as multiple timing constraints, asynchronous conditions and architectural constraints. In addition, traditional retiming algorithms were very slow because binary searching was used to find a best retiming. For FPGA circuit netlists having n elements, retiming algorithms had in worst-case scenarios an $n^2 \log(n)$ complexity. This was undesirable from a design standpoint.

Thus, what is needed is an efficient method and apparatus for performing retiming on FPGAs.

SUMMARY

According to an embodiment of the present invention, a retiming procedure is described that improves a maximum frequency at which circuits can operate. The procedure allows the movement of registers throughout the circuit to reduce the length of very long paths at the expense of short paths. The procedure operates in linear time while respecting timing and architectural constraints imposed by a FPGA. In one embodiment, near-critical paths of a system are identified. Registers having an input connected to a near-critical path are moved backwards along the path to an input of a look up table. Registers having an output connected to a near-critical path are moved forward along the path to an output of a look up table. If illegalities in placement exist, non-critical components are shifted in order to satisfy preferred locations and produce a legal placement.

BRIEF DESCRIPTION OF THE DRAWINGS

The features and advantages of the present invention are illustrated by way of example and are by no means intended to limit the scope of the present invention to the particular embodiments shown, and in which:

FIG. 6b illustrates how the exemplary registers in FIG. 6a may be pushed backward according to an embodiment of the present invention;

FIG. 9 illustrates an example of how registers connected to a LUT in a carry chain may be pushed forward according to an embodiment of the present invention;

DETAILED DESCRIPTION

Figure 1:
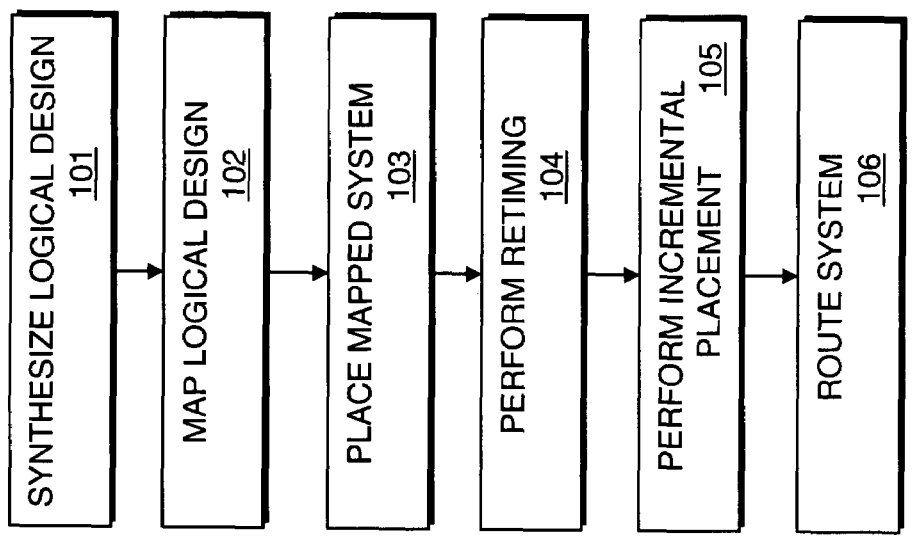
FIG. 1 is a flow chart illustrating a method for designing a system according to an embodiment of the present invention.

FIG. 1 is a flow chart that illustrates a method for designing a system according to an embodiment of the present invention. The method may be performed with the assistance of an EDA tool, for example. At 101, synthesis is performed. Synthesis includes generating a logic design of the system to be implemented by a target device. According to an embodiment of the present invention, synthesis generates an optimized logical representation of the system from a Hardware Description Language (HDL) design definition. The optimized logical representation of the system may include a representation that includes a minimized number of logic gates and logic elements required for the system. Alternatively, the optimized logical representation of the system may include a representation that has a reduced depth of logic and that generates a lower signal propagation delay.

Figure 2:
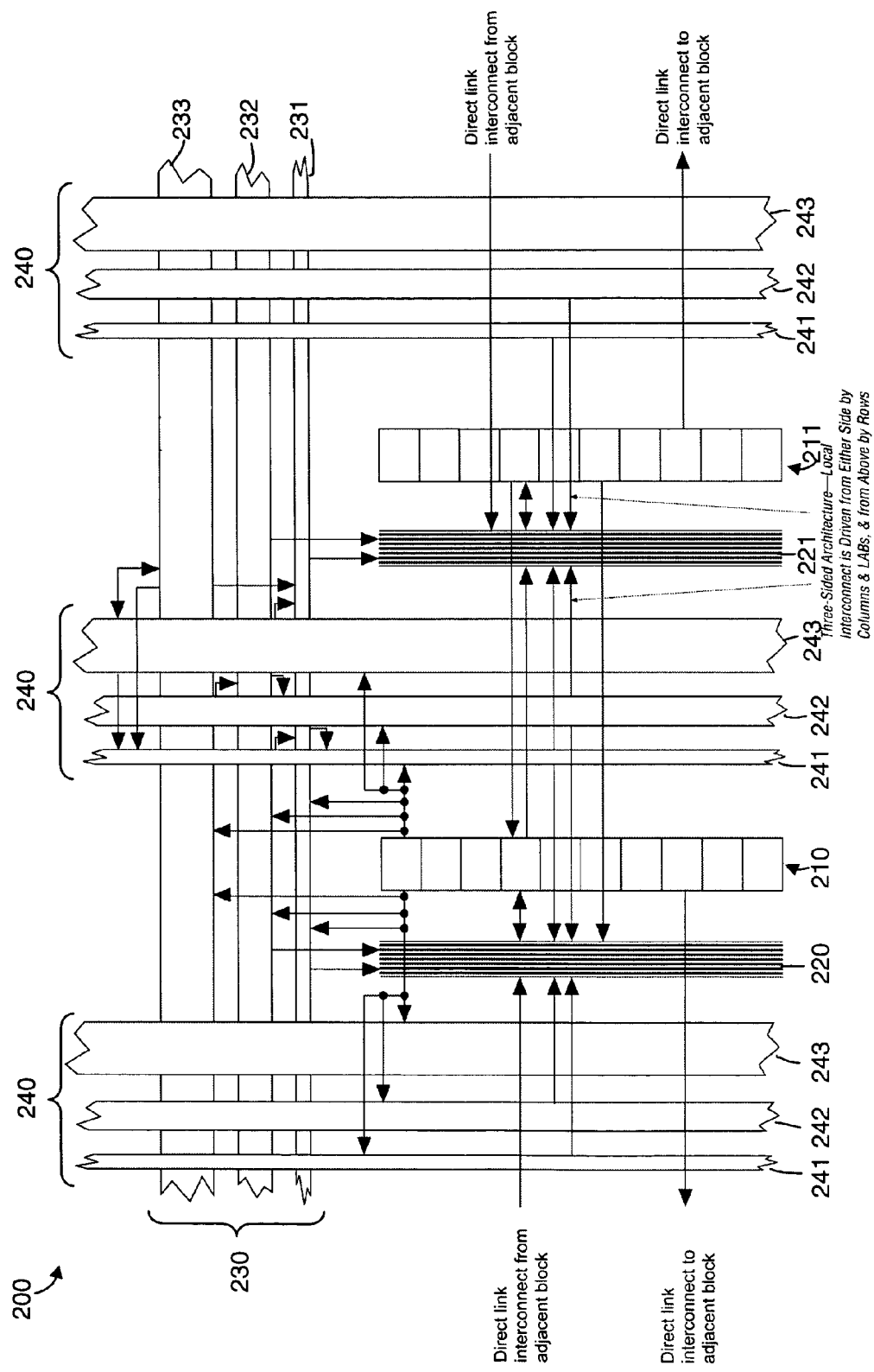
FIG. 2 illustrates a target device utilizing FPGAs according to an embodiment of the present invention.

FIG. 2 illustrates an exemplary target device 200 utilizing FPGAs according to an embodiment of the present invention. The present invention may be used to design a system onto the target device 200. According to one embodiment, the target device 200 is a chip having a hierarchical structure that may take advantage of wiring locality properties of circuits formed therein. The lowest level of the hierarchy is a logic element (LE) (not shown). An LE is a small unit of logic providing efficient implementation of user logic functions. According to one embodiment of the target device 200, an LE may include a 4-input lookup table (LUT) with a configurable flip-flop.

The target device 200 includes a plurality of logic-array blocks (LABs). Each LAB is formed from 10 LEs, LE carry chains, LAB control signals, LUT chain, and register chain connection lines. LUT chain connections transfer the output of one LE's LUT to the adjacent LE for fast sequential LUT connections within the same LAB. Register chain connection lines transfer the output of one LE's register to the adjacent LE's register within a LAB. LABs are grouped into rows and columns across the target device 200. A first column of LABs is shown as 210 and a second column of LABs is shown as 211.

The target device 200 includes memory blocks (not shown). The memory blocks may be, for example, dual port random access memory (RAM) blocks that provide dedicated true dual-port, simple dual-port, or single port memory up to various bits wide at up to various frequencies. The memory blocks may be grouped into columns across the target device in between selected LABs or located individually or in pairs within the target device 200.

The target device 200 includes digital signal processing (DSP) blocks (not shown). The DSP blocks may be used to implement multipliers of various configurations with add or subtract features. The DSP blocks include shift registers, multipliers, adders, and accumulators. The DSP blocks may be grouped into columns across the target device 200.

The target device 200 includes a plurality of input/output elements (IOEs) (not shown). Each IOE feeds an I/O pin (not shown) on the target device 200. The IOEs are located at the end of LAB rows and columns around the periphery of the target device 200. Each IOE includes a bidirectional I/O buffer and a plurality of registers for registering input, output, and output-enable signals. When used with dedicated clocks, the registers provide performance and interface support with external memory devices.

The target device 200 includes LAB local interconnect lines 220-221 that transfer signals between LEs in the same LAB. The LAB local interconnect lines are driven by column and row interconnects and LE outputs within the same LAB. Neighboring LABs, memory blocks, or DSP blocks may also drive the LAB local interconnect lines 220-221 through direct link connections.

The target device 200 also includes a plurality of row interconnect lines ("H-type wires") 230 that span fixed distances. Dedicated row interconnect lines 230, that include H4 231, H8 232, and H24 233 interconnects, route signals to and from LABs, DSP blocks, and memory blocks within the same row. The H4 231, H8 232, and H2 233 interconnects span a distance of up to four, eight, and twenty-four LABs respectively, and are used for fast row connections in a four-LAB, eight-LAB, and twenty-four-LAB region. The row interconnects 230 may drive and be driven by LABs, DSP blocks, RAM blocks, and horizontal IOEs.

The target device 200 also includes a plurality of column interconnect lines ("V-type wires") 240 that operate similarly to the row interconnect lines 230. The column interconnect lines 240 vertically routes signals to and from LABs, memory blocks, DSP blocks, and IOEs. Each column of LABs is served by a dedicated column interconnect, which vertically routes signals to and from LABs, memory blocks, DSP blocks, and IOEs. These column interconnect lines 240 include V4 241, V8 242, and V16 243 interconnects that traverse a distance of four, eight, and sixteen blocks respectively, in a vertical direction.

FIG. 2 illustrates an exemplary embodiment of a target device. It should be appreciated that a system may include a plurality of target devices, such as that illustrated in FIG. 2, cascaded together. It should also be appreciated that the target device may include programmable logic devices arranged in a manner different than that on the target device 200. A target device may also include FPGA resources other than those described in reference to the target device 200. Thus, while the invention described herein may be utilized on the architecture described in FIG. 2, it should be appreciated that it may also be utilized on different architectures, such as those employed by Altera® Corporation in its APEX™, and Mercury™ family of chips and those employed by Xilinx®, Inc. in its Virtex™ and Virtex™ II line of chips.

Figure 3:
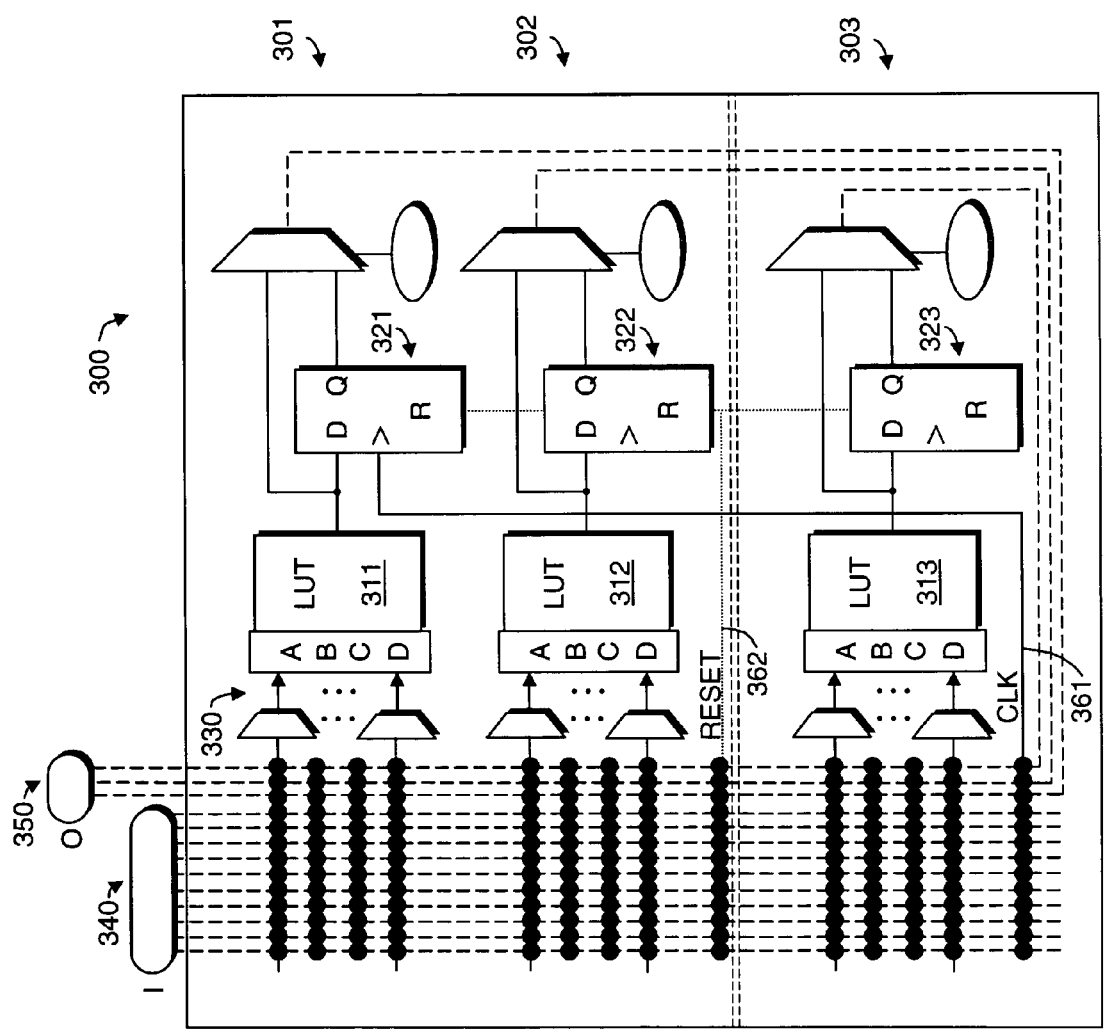
FIG. 3 illustrates a LAB according to an embodiment of the present invention.

FIG. 3 illustrates a LAB or clustered logic block 300 according to an embodiment of the present invention. The LAB 300 may be used to implement any of the LABs shown in FIG. 2. LEs 301-303 illustrates a first, second, and tenth LE in the LAB 300. The LEs 301-303 each have a 4-input lookup table 311-313, respectively, and a configurable register 321-323s, respectively, connected at its output. The LAB 300 includes a set of input pins 340 and a set of output pins 350 that connect to the general-purpose routing fabric so that LAB can communicate with other LABs. The inputs to lookup tables 311-313 can connect to any one of the input pins 340 and output pins 350 using the appropriate configuration bits for each of the multiplexers 330. The number of LEs, $n_E$, input pins, $n_I$, and output pins, no in a LAB impose important architectural constraints on a system. In addition, since a single clock line 361 and a single asynchronous set/reset line 362 is attached to each configurable register 321-323, the configurable registers 321-323 must be clocked by the same signal and initialized by the same signal. The number of clock lines available in a LAB is represented by $n_C$. The number of reset lines available in a LAB is represented by $n_R$.

Referring back to FIG. 1, at 102, the optimized logical design of the signal is mapped. Mapping includes determining how to implement components such as logic gates and other logic components in the optimized logic representation with resources available on a target device. According to an embodiment of the present invention, a netlist is generated from mapping. The netlist illustrates how the resources of the target device are utilized to implement the system. The netlist may, for example, include a representation of the components on the target device and how the components are connected. Mapping may include, for example, determining how components may be implemented using LEs. The components may include, for example, digital logic such as logic gates, memory devices, and/or other components. Mapping may also include, for example, determining which LEs should be packed together in a LAB. Although the resources on a target device are assigned for implementing the components, the specific resources and their locations are not assigned in 102.

At 103, the mapped logical system design is placed. Placement includes fitting the system on the target device by determining which resources (and their location) on the target device is to be used for specific components and connections between the components. The placement procedure may be performed by a placer in an EDA tool that utilizes placement algorithms. According to an embodiment of the present invention, a user (designer) may provide input to the placer by specifying placement constraints. The constraints may include defining logic regions that group certain components of a system together. The size of the logic regions may be determined by the user or by a sizing method. The placement of the logic regions may be determined by the user or by a placement method.

At 104, retiming is performed on the system. According to an embodiment of the present invention, retiming involves moving identified registers across combinational circuit elements to reduce the length of timing-critical or near-critical paths. Registers with an input coupled to a near-critical path are candidates for a push backward. A push backward involves moving the register backwards on the near-critical path to an input of a LUT. For the backward push to occur, a register needs to be present on each fanout of the LUT. Registers with an output coupled to a near-critical path are candidates for a push forward. A push forward involves moving the register forward on the near-critical path to an input of a LUT. For the forward push to occur, a register has to be present at each input of the LUT.

Figure 4:
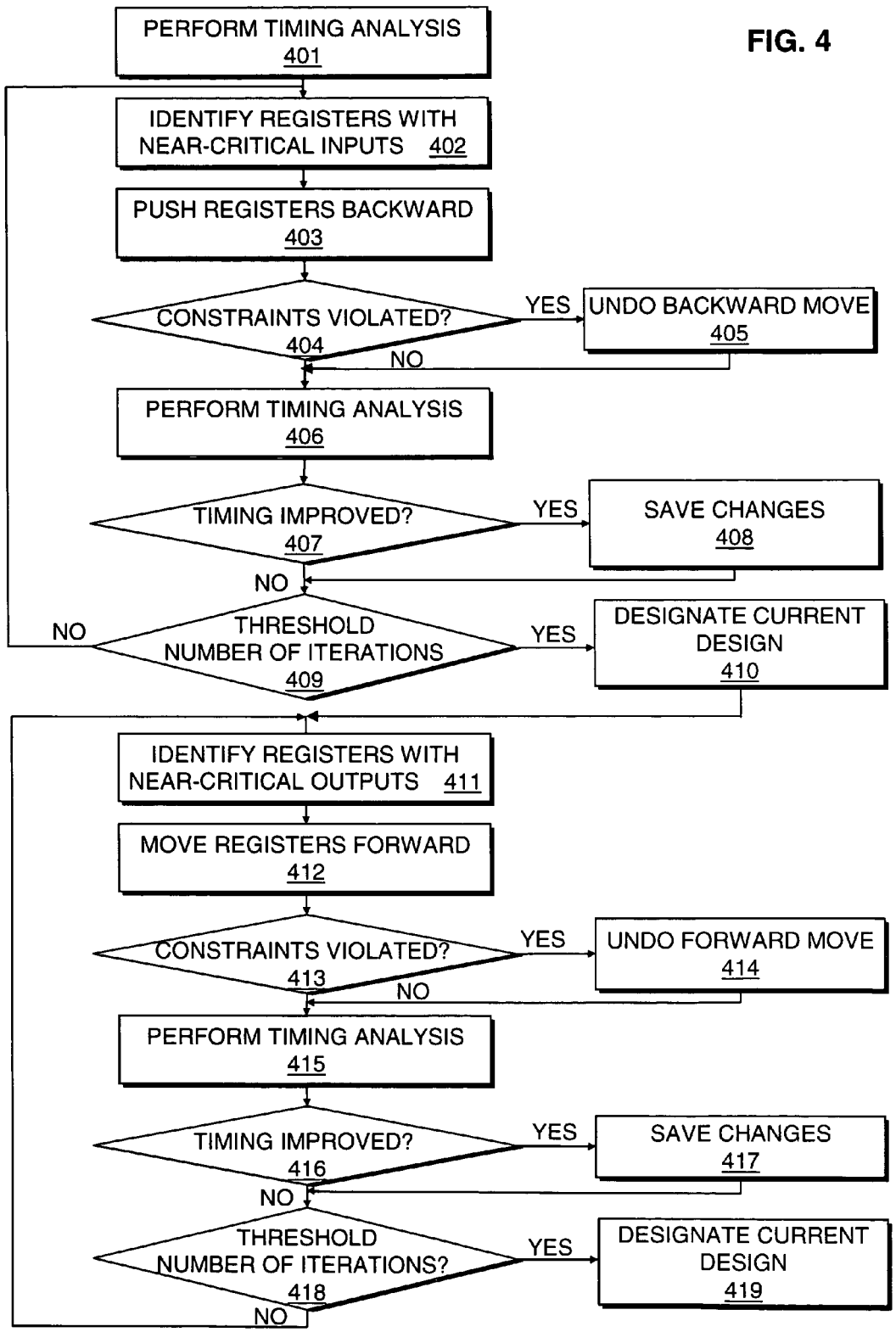
FIG. 4 is a flow chart illustrating a method for performing retiming according to an embodiment of the present invention.

FIG. 4 is a flow chart illustrating a method for performing retiming according to an embodiment of the present invention. The method shown in FIG. 4 may be used to implement 104 shown in FIG. 1. At 401, timing analysis is performed on the system to determine the timing of the system. The timing analysis uses approximations since routing has not yet been performed. According to an embodiment of the present invention, timing analysis determines wire delay assuming that the best possible routes will be used for each connection in the system. Timing analysis establishes the length for each path in the system as well as the slack for each path in the system. Slack may be defined to be the amount of delay that can be added to a path before it becomes critical.

At 402, registers with inputs connected to near-critical paths are identified. According to an embodiment of the present invention, a near-critical path is a path in the system with a slack value below a threshold value.

At 403, the identified registers at 402 are pushed backwards. According to an embodiment of the present invention, a push backward involves moving the register backwards on the near-critical path to an input of a LUT. For the backward push to occur, a register needs to be present on each fanout of the LUT.

Figure 5A:
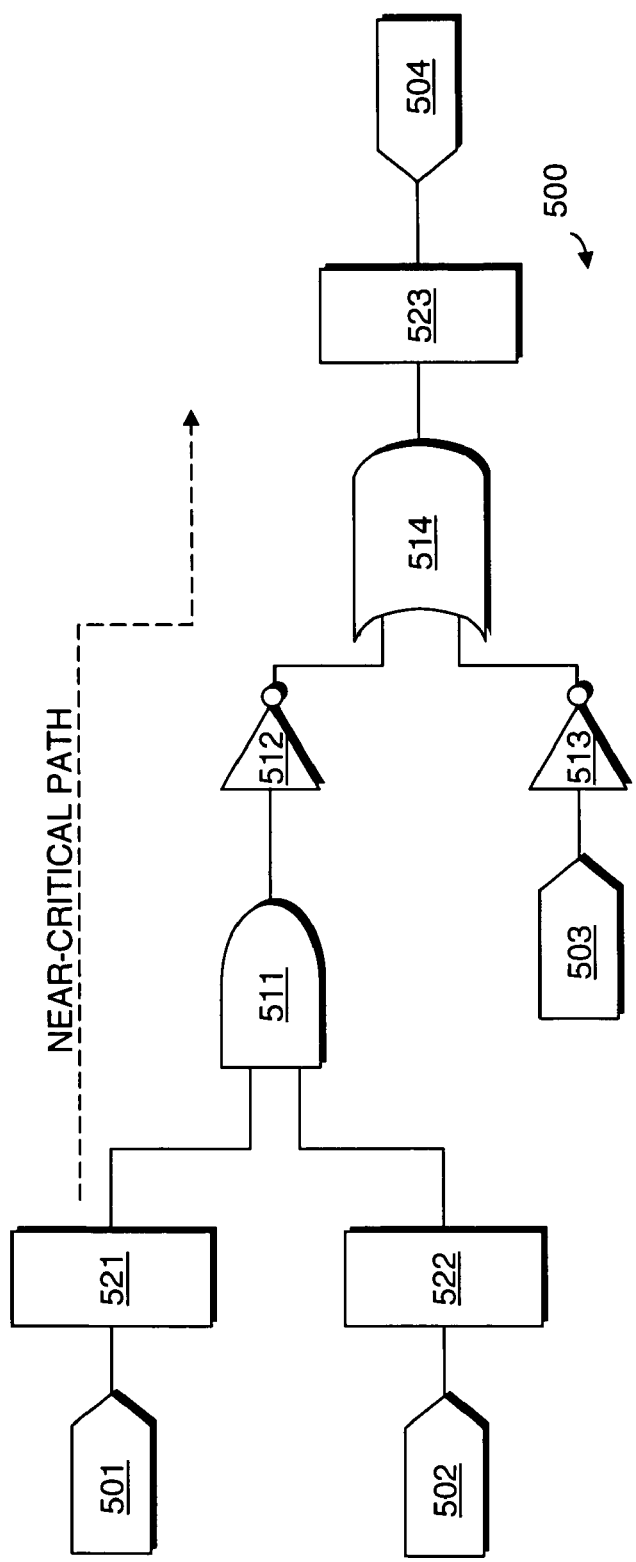
FIG. 5a illustrates an exemplary circuit.
Figure 5B:
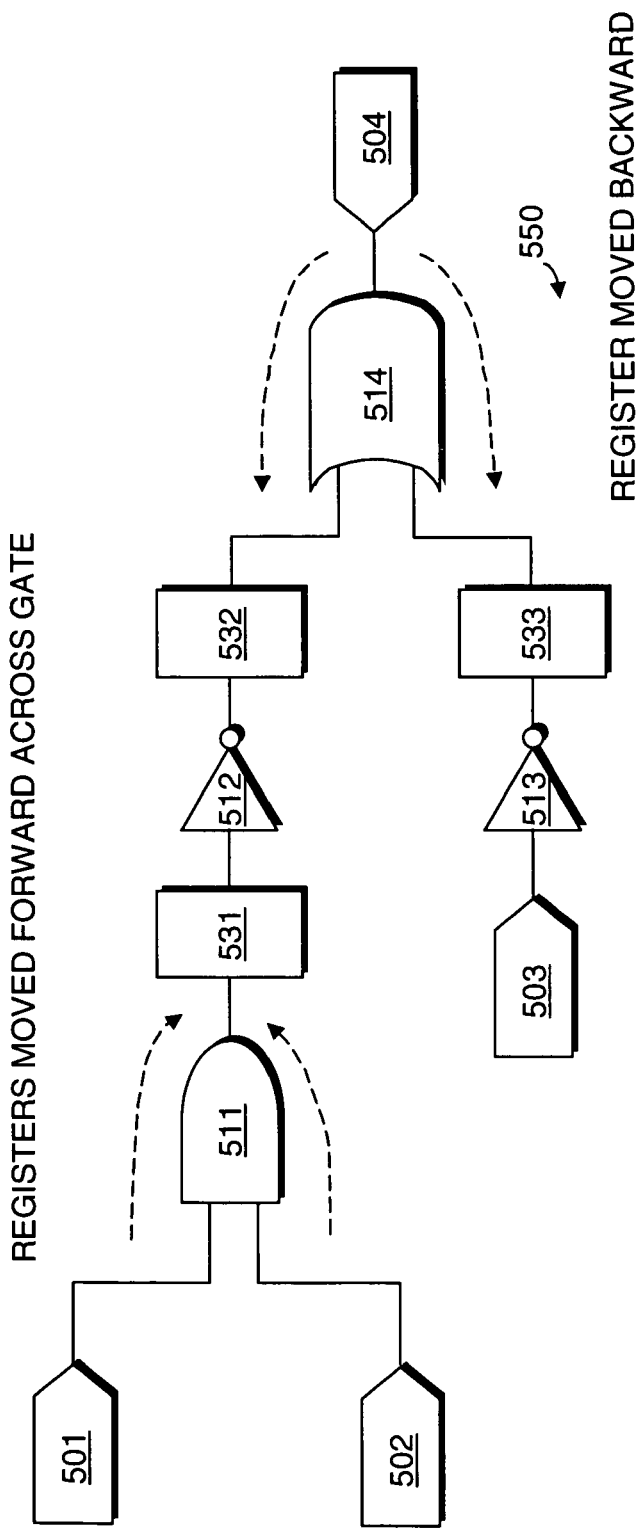
FIG. 5b illustrates how registers in the exemplary circuit shown in FIG. 5a may be pushed backwards and forward according to an embodiment of the present invention.

FIGS. 5a and 5b illustrate an example of a backward push according to an embodiment of the present invention. The circuit 500 includes input pins 501-503 and output pin 504. The circuit 500 includes AND gate 511, inverters 512 and 513, and OR gate 514. The logic components 511-514 may be implemented using LUTs. In FIG. 5a, registers 521 and 522 are coupled to the input of AND gate 511, and register 523 is coupled to the output of OR gate 514. If register 523 is determined to have an input connected to a near-critical path, it may be pushed back as illustrated in the circuit 550 shown in FIG. 5b. When pushing back register 523, it is moved backwards on the critical path behind the LUT implementing the OR gate 514 to its inputs. The register 523 shown in FIG. 5a is implemented with registers 532 and 533 in FIG. 5b.

Figure 6A:
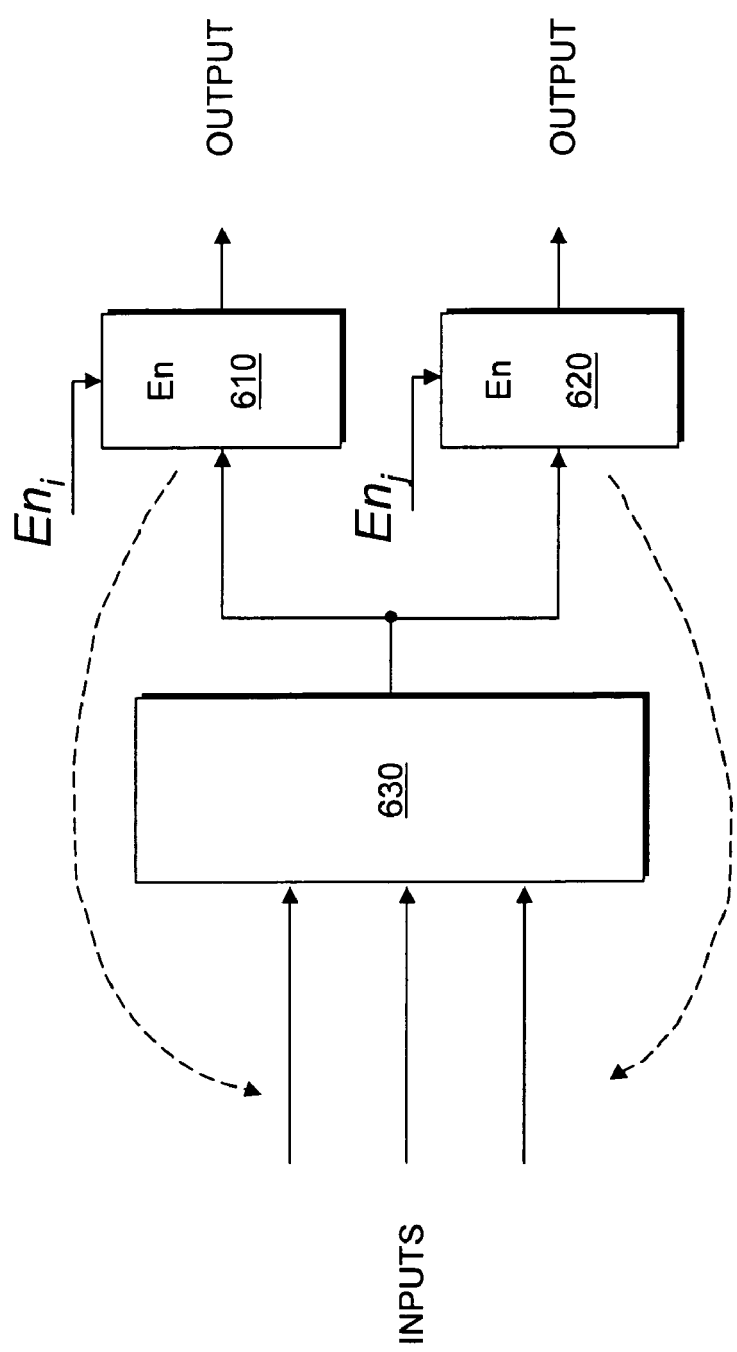
FIG. 6a illustrates exemplary registers having incompatible control signals that are candidates for a push backward according to an embodiment of the present invention.

For backward pushes to occur, the registers present on each fanout of a LUT must have compatible control signals such as enable, reset, and other control signals. FIG. 6a illustrates an example of registers 610 and 620 having incompatible control signals that are candidates for a push backward according to an embodiment of the present invention. Registers 610 and 620 are present on a fanout of LUT 630. The path through LUT 630 is also a near-critical path. A typical push back where secondary signals to the registers, such as control signals, are compatible involves moving the registers as shown by the dotted lines in FIG. 6a. In this example, however, the enable signal to register 610 is not the same as the enable signal to register 620. In order to perform a backward push on registers 610 and 620, the LUT 630 is duplicated as shown in FIG. 6b. The LUT 630 is duplicated so that the fanout of the LUT 630 and its duplicate LUT 631 can be connected to registers 610 and 620 separately. This allows the fanouts of registers 610 and 620 to have compatible registers. The push backward of register 610 and/or register 620 can proceed as shown with the dotted lines in FIG. 6b.

Figure 7:
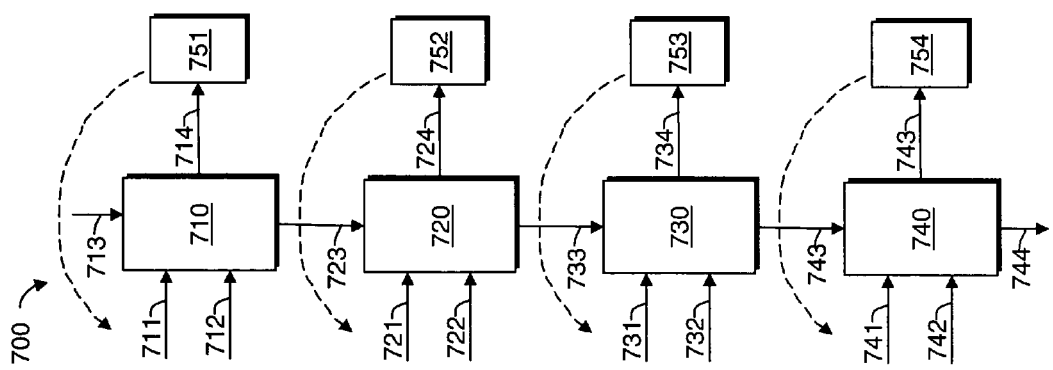
FIG. 7 illustrates an example of how a register connected to a LUT in a carry chain may be pushed backward according to an embodiment of the present invention.

Some FPGA architectures support a mode of operation which allows carry chains. Carry chains provide high speed implementations of arithmetic logic. Signal propagating along the chain must be strictly combinational since most FPGA architectures do not allow for registers between chain elements. FIG. 7 illustrates an example of how a register connected to a LUT in a carry chain 700 may be pushed backward according to an embodiment of the present invention. Carry chain 700 includes a plurality of LUTs 710, 720, 730, and 740. Each of the LUTs 710, 720, 730, and 740 includes a plurality of inputs 711-713, 721-723, 731-733, and 741-743 and outputs 714 and 723, 724 and 733, 734 and 743, and 744 and 745 respectively. An attempt to backward push one of the registers 752-754 across a single LUT in the carry chain 700 would result in illegalities because a register would have to be inserted on a special interconnect between LUTs in the carry chain 700 such as 723, 733, and/or 743. In order to perform a backward push on one of the registers 752-754, it is determined whether the outputs of the LUTs in the carry chain 700 not connected to the carry chain 700 feed a register. If this condition is satisfied and all of the registers have compatible secondary signals, such as control signals, then the entire group of registers is pushed across the chain as shown by the dotted lines in FIG. 7.

At 404 it is determined whether pushing any of the registers backwards at 403 causes a violation of a constraint. According to an embodiment of the present invention, constraints may include user-defined timing constraints. Constraints may include area constraints for the system such as global constraints on the maximum area increase allowed and constraints that ensure that registers are created evenly across the system. Constraints may include architectural constraints that define rules for handling carry chains and various restrictions on secondary signals such as control signals. Constraints may include implicit legality constraints, such as constraints for moving registers feeding asynchronous lines, to ensure that the system functions correctly after retiming is performed. Constraints may include user defined constraints such as constraints that prohibit the placement of components on designated sections of the target device. It should be appreciated that other types of constraints may also be defined and included for the purpose of determination of violation at 404. If it is determined that pushing any of the registers backwards causes a violation of a constraint, control proceeds to 405. If it is determined that pushing any of the registers backwards does not cause a violation of a constraint, control proceeds to 406.

At 405, backward pushes that result in violations are undone. Control proceeds to 406.

At 406, timing analysis is performed. Timing analysis is performed to determine the effect of pushing the registers backwards. Timing analysis establishes the length for each path in the system as well as the slack for each path in the system. According to an embodiment of the present invention, timing analysis may be performed as described at 401.

At 407, it is determined whether the timing of the system has improved. Determining whether timing of the system has improved may be achieved by comparing the slack values of near-critical paths in the recently retimed system design with a previous system design. If the timing of the system has improved, control proceeds to 408. If the timing of the system has not improved, control proceeds to 409.

At 408, the current changes to the system are saved. The current changes to the system include the changes made at 403.

At 409, it is determined whether a threshold number of iterations of 402-408 has been performed. If a threshold number of iterations of 402-408 has not been performed, control returns to 402. If a threshold number of iterations of 402-408 has been performed, control proceeds to 410.

At 410, the current changes saved at 408 are designated as the current design for the system.

At 411, registers with outputs coupled to near-critical paths are identified. According to an embodiment of the present invention, a near-critical path is a path in the system with a slack value below a threshold value.

At 412, the identified registers at 411 are pushed forward. According to an embodiment of the present invention, a push forward involves moving the register forward on the near-critical path to an output of a LUT. For the forward push to occur, a register needs to be present on each input of the LUT.

FIGS. 5*a* and 5*b* illustrate an example of a forward push according to an embodiment of the present invention. If register 521 is determined to have an output connected to a near-critical path, it may be pushed forward since register 522 is also at an input to the AND gate 511. When pushing forward register 521 and 522, the registers are moved forward on the critical path in front of the LUT implementing the AND gate 511 to its output. The registers 521 and 522 shown in FIG. 5*a* are implemented with register 531 shown in FIG. 5*b*.

Figure 8A:
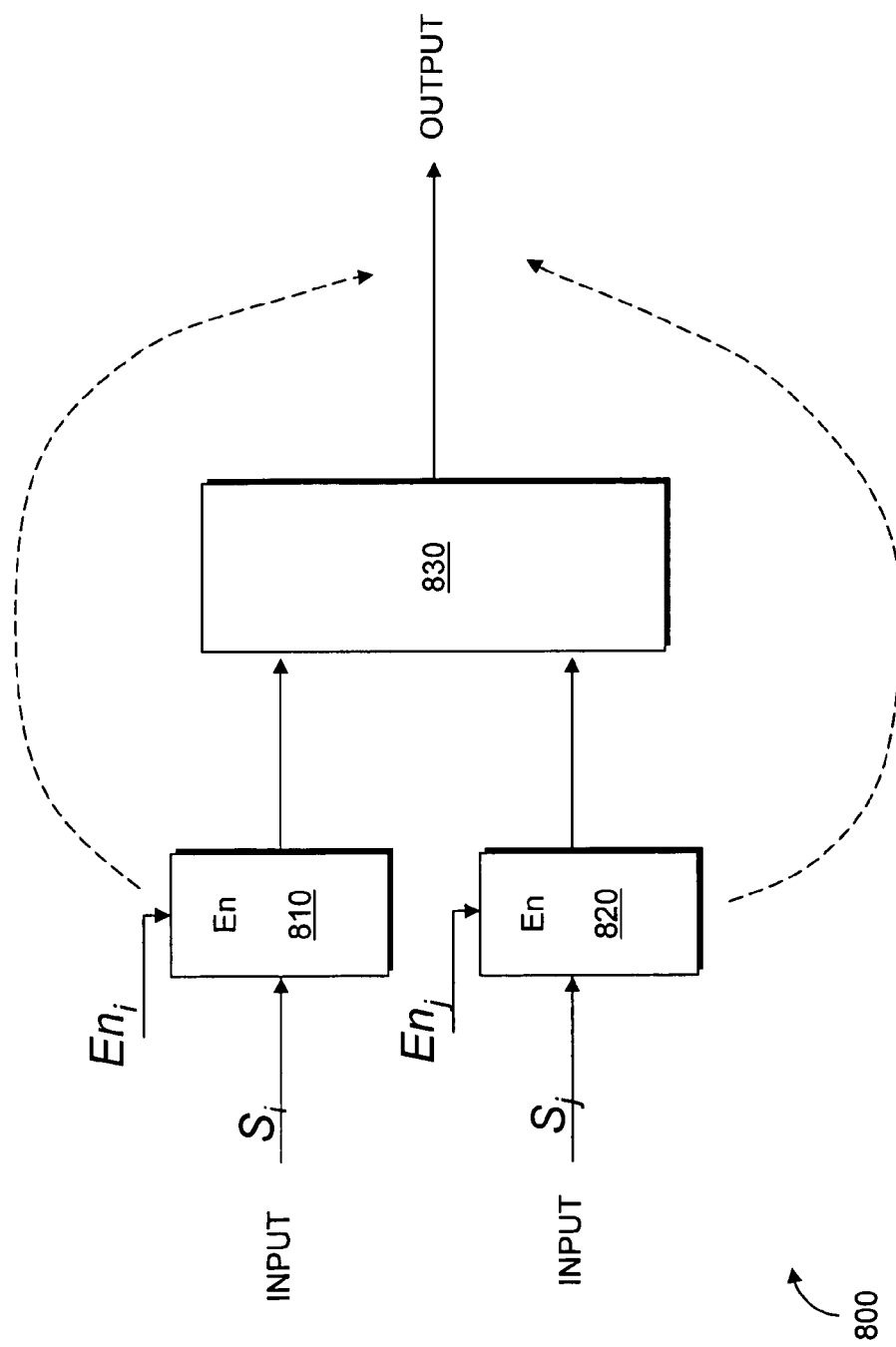
FIG. 8a illustrates exemplary registers having incompatible control signals that are candidates for a push forward according to an embodiment of the present invention.
Figure 8B:
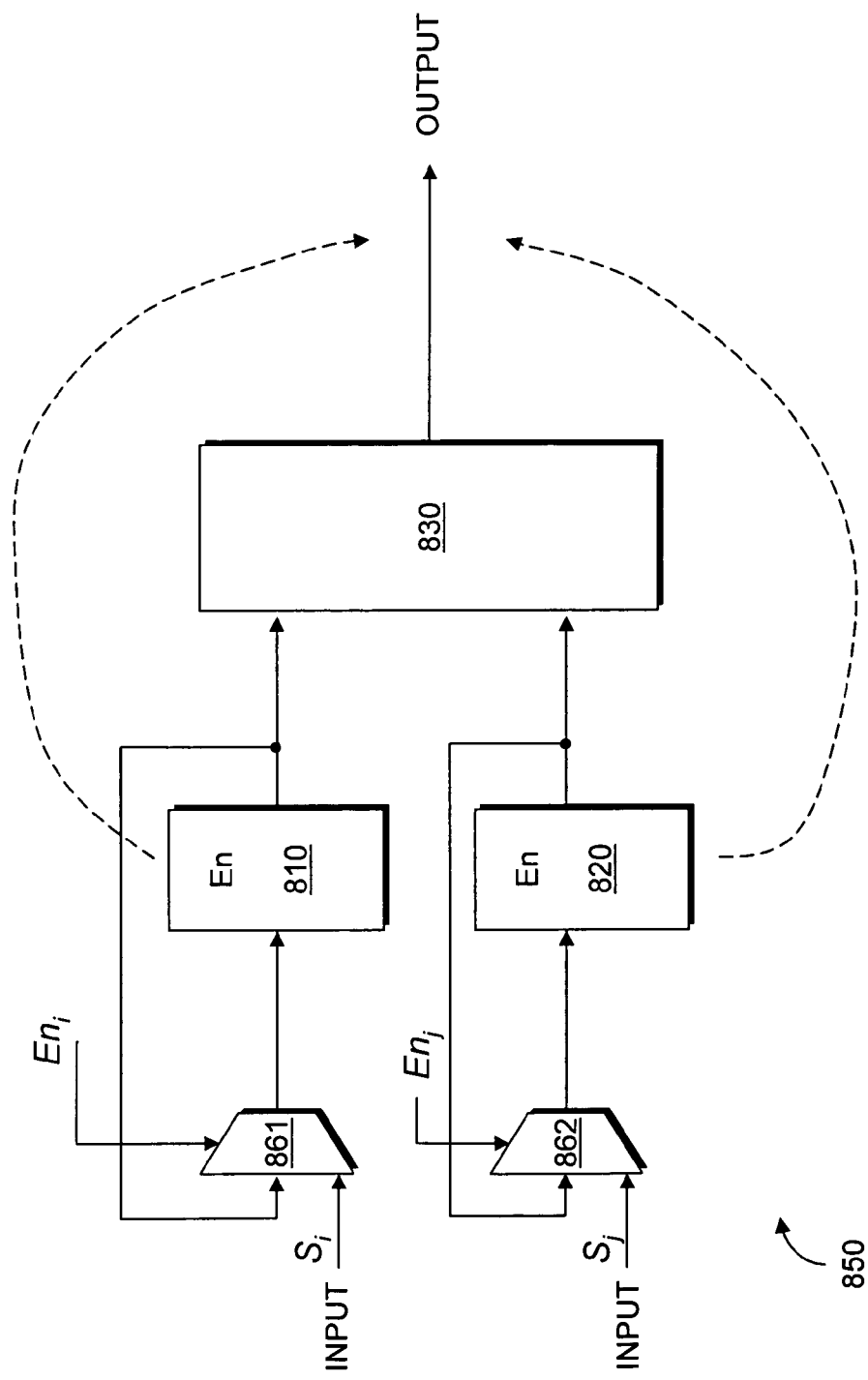
FIG. 8b illustrates how the exemplary registers in FIG. 8a may be pushed forward according to an embodiment of the present invention.

For forward pushes to occur, the registers present on each input of a LUT must have compatible control signals such as enable, reset, and other control signals. FIG. 8*a* illustrates an example of registers 810 and 820 having incompatible control signals that are candidates for a push backward according to an embodiment of the present invention. Registers 810 and 820 are present on inputs of LUT 830. The path through LUT 830 is also a near-critical path. A typical push forward where secondary signals to the registers, such as control signals, are compatible involves moving the registers as shown by the dotted lines in FIG. 8*a*. In this example, however, the enable signal to register 810 is not the same as the enable signal to register 820. In order to perform a forward push on registers 810 and 820, the circuit 800 is transformed into an equivalent circuit 850 as shown in FIG. 8*b*. The transformed circuit 850 includes multiplexer logic 861 and 862 to implement the clock enable functionality for registers 810 and 820 respectively. According to one embodiment, the multiplexer logic 861 and 862 may be implemented using available LUTs on the target device. The multiplexer logic 861 and 862 allow the registers 810 and 820 to operate without processing enable signals. Registers 810 and 820 may now be pushed forward as shown by the dotted lines in FIG. 8*b*.

Some FPGA architectures support a mode of operation which allows carry chains. Carry chains provide high speed implementations of arithmetic logic. Signal propagating along the chain must be strictly combinational since most FPGA architectures do not allow for registers between chain elements. FIG. 9 illustrates an example of how a register connected to a LUT in a carry chain 900 may be pushed forward according to an embodiment of the present invention. Carry chain 900 includes a plurality of LUTs 910, 920, 930, and 940. Each of the LUTs 910, 920, 930, and 940 includes a plurality of inputs 911-912, 921-922, 931-932, and 941-942 and outputs 913 and 922, 923 and 932, 933 and 942, and 943 and 944 respectively. An attempt to forward push one of the registers 952-954 across a single LUT in the carry chain 900 would result in illegalities because a register would have to be inserted on a special interconnect between LUTs in the carry chain 900 such as 922, 932, and/or 942. In order to perform a forward push on one of the registers 952-954, it is determined whether the inputs of the LUTs in the carry chain 900 is fed by a register. If this condition is satisfied and all of the registers have compatible secondary signals, such as control signals, then the entire group of registers is pushed across the chain as shown by the dotted lines in FIG. 9.

Figure 10:
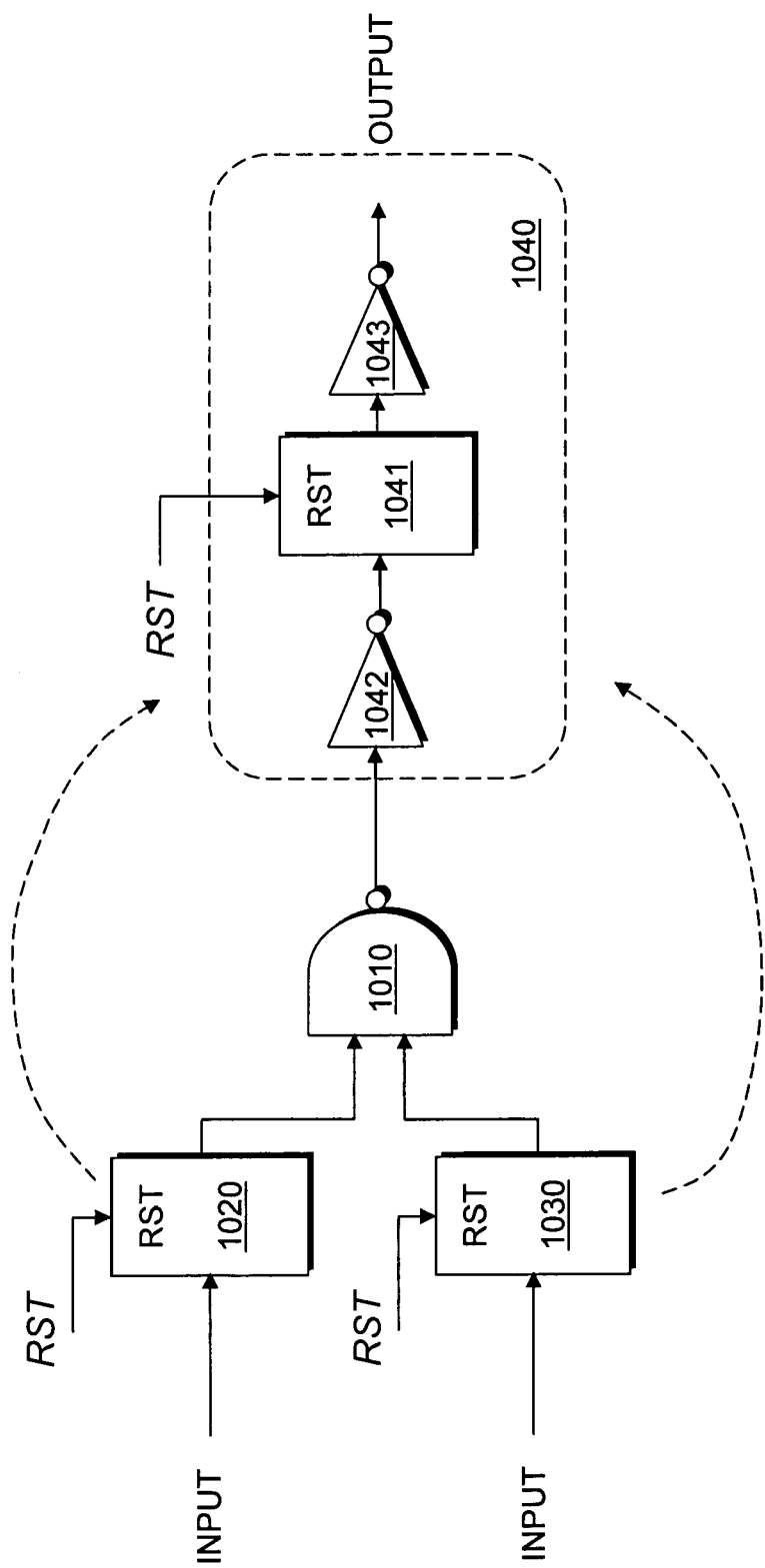
FIG. 10 illustrates an example of how reset/power-up states are handled according to an embodiment of the present invention.

When registers are moved during retiming, consideration is given to resulting reset/power-up states. For example, if registers on a target device are set to logic 0s at power-up and when the asynchronous reset signals are asserted, movement of the registers may generate a different value along a path. FIG. 10 illustrates an example of how reset/power-up states are handled according to an embodiment of the present invention. In this example, an LUT 1010 implements the functionality of a NAND gate. The output of the LUT 1010 is set to a value of logic 1 when the input registers 1020 and 1030 are reset or at power-up. In order to ensure that this reset/power-up condition is maintained after a forward push is performed, a reset-high circuit 1040 may be inserted at the output of the LUT as shown in FIG. 10. The reset-high circuit 1040 includes a register 1041 similar to the registers 1020 and 1030 and inverters 1042 and 1043 at the input and output of the register 1041. The techniques and consideration shown with reference to FIG. 10 may be used for all forward or backward pushes.

At 413 it is determined whether pushing any of the registers forwards at 412 causes a violation of a constraint.

The constraints described with reference to 404 may be used at 413. If it is determined that pushing any of the registers forward causes a violation of a constraint, control proceeds to 414. If it is determined that pushing any of the registers forward does not cause a violation of a constraint, control proceeds to 415.

At 414, forward pushes that result in violations are undone. Control proceeds to 415.

At 415, timing analysis is performed. Timing analysis is performed to determine the effect of pushing the registers forward. Timing analysis establishes the length for each path in the system as well as the slack for each path in the system. According to an embodiment of the present invention, timing analysis may be performed as described at 401.

At 416, it is determined whether the timing of the system has improved. Determining whether timing of the system has improved may be achieved by comparing the slack values of near-critical paths in the recently retimed system design with a previous system design. If the timing of the system has improved, control proceeds to 417. If the timing of the system has not improved, control proceeds to 418.

At 417, the current changes to the system are saved. The current changes to the system include the changes made at 412.

At 418, it is determined whether a threshold number of iterations of 411-417 has been performed. If a threshold number of iterations of 411-417 has not been performed, control returns to 411. If a threshold number of iterations of 411-417 has been performed, control proceeds to 419.

At 419, the current changes saved at 417 are designated as the current design for the system.

FIG. 4 illustrates an embodiment of the present invention where a series of push backwards are performed on identified registers followed by a series of push forwards. It should be appreciated that additional pushes may be performed at a different order. These additional pushes may be made with changes in the definition of near-critical paths. For example, after 417 shown in FIG. 4, the threshold value of criticality for determining a near-critical path may be changed and additional push backwards and push forwards may be performed as described with reference to 402-418.

By performing retiming on identified registers that are on paths that are designated as being near-critical, the method described with reference to FIG. 4 allows retiming to be performed in an effective and efficient manner. For an FPGA circuit netlist having n elements, the worst-case complexity of this procedure is in the order of n which is an improvement over prior approaches.

Referring back to FIG. 1, at 105, incremental placement is performed. The changes to the netlist generated from retiming are placed on the layout of the existing system at 103. Incremental placement involves evaluating resources on a target device such as LABs that have architectural violations or illegalities from layout-driven optimizations. Incremental placement attempts to perturb the preferred locations as little as possible to ensure that the final placement respects all architectural constraints. Incremental placement attempts to identify non-critical LEs that may be moved from their preferred locations to resolve architectural violations in order that truly critical elements may stay at their preferred locations. Incremental placement may be performed by an incremental placement engine (not shown) in the EDA tool that utilizes incremental placement algorithms.

In performing incremental placement, an architectural description of the target device, A, and a netlist, N(E,C), that includes a set of logic elements, E, and a set of connections, C, is processed. Each element, e, is associated with a preferred physical location, $(p_x(e), p_y(e))$. According to an embodiment of the present invention, all atoms of the netlist have a preferred location. Incremental placement generates a set of mapped locations, M, for each logic elements in N. Incremental placement tries to find a mapping from preferred locations to mapped locations, P→M, such that the mapped locations are architecturally feasible as well as being minimally disruptive. The definition of minimal disruption depends on the goal of netlist optimization.

According to an embodiment of the present invention, the goal of netlist optimization is to optimize timing of the system. In this embodiment, T(S) represent an estimate of the critical path delay if all logic elements in E are mapped to $(s_x(e), s_y(e))$. The estimate may ignore the legality of locations and may be computed assuming a best case route is possible for each connection. In this example, P→M is minimally disruptive if incremental placement minimizes {T(M)−T(P)}. Any logic element can be moved from its preferred location as long as it does not degrade the critical path. According to one embodiment, routing area is also tracked to control excessive routing congestion. In this embodiment, A(S) represents the routing area consumed if the logic elements are mapped to $(s_x(e), s_y(e))$. Minimal disruptiveness is satisfied by minimizing the relationships shown below.

$$\{T(M)-T(P)\}+\{A(M)-A(P)\} \tag{1}$$

Figure 11:
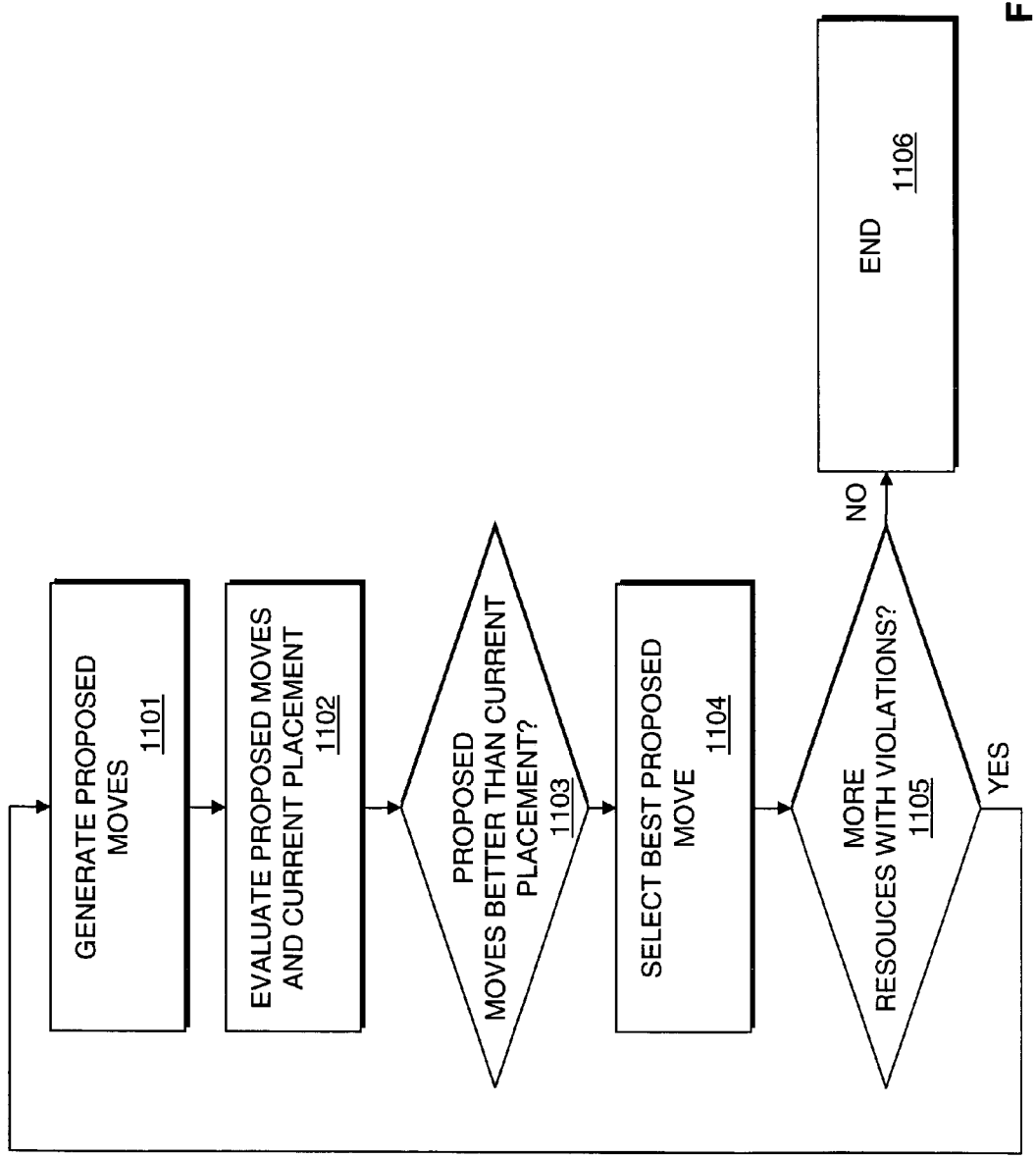
FIG. 11 is a flow chart illustrating a method for performing incremental placement according to an embodiment of the present invention.

FIG. 11 is a flow chart illustrating a method for performing incremental placement according to an embodiment of the present invention. The method described in FIG. 11 may be used to perform incremental placement as shown as 105 in FIG. 1. At 1101 proposed moves for all LEs in a LAB having architectural violations are generated. According to an embodiment of the present invention, proposed moves may include a move-to-fanin, move-to-fanout, move-to-sibling, move-to-neighbor, move-to-space, a move towards a critical vector, and other moves. A move-to-fanin involves moving an LE to a LAB that is a fanin of the LE. A move-to-fanout involves moving an LE to a LAB that is a fanout of the LE. A move-to-sibling involves moving an LE to a LAB that is fanout of a LAB that fans in to the LAB of the LE.

Figure 12:
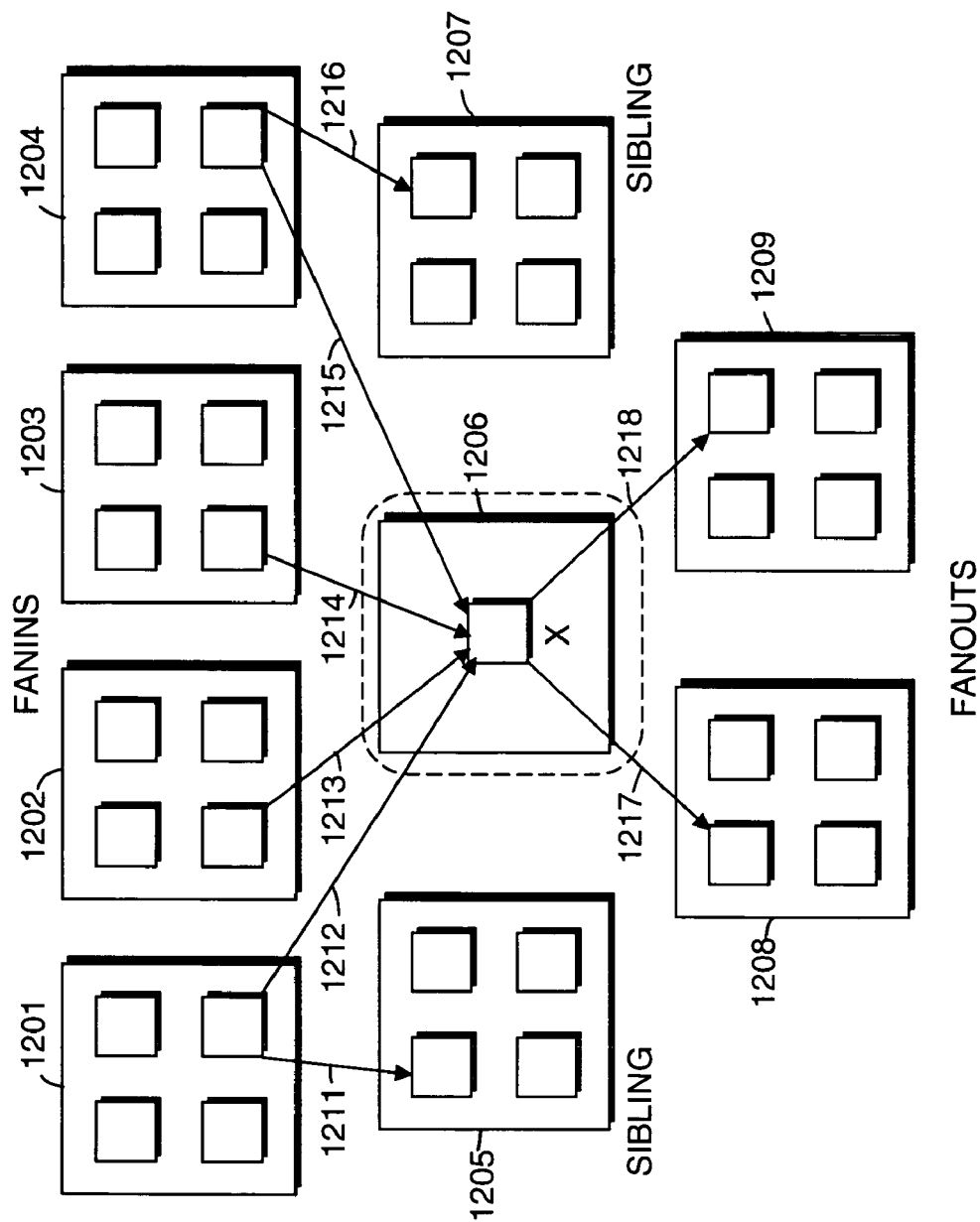
FIG. 12 illustrates fanin, fanout, and sibling relationship move proposals according to an embodiment of the present invention.

FIG. 12 illustrates examples of a move-to-fanin, move-to-fanout, and move-to-sibling. When a first LE in a first LAB transmits a signal to a second LE in a second LAB, the first LAB is said to be a fanin of the second LE. When a first LE in a first LAB receives a signal from a second LE in a second LAB, the first LAB is said to be a fanout of the second LE. When a first LE from a first LAB receives a signal from a second LE from a second LAB that also transmits to a third LE in a third LAB, the first LAB and the third LABs are said to be siblings. Blocks 1201-1209 illustrates a plurality of LABs. Each of the LABs 1201-1209 has a number of shown LEs. A plurality of arrows 1211-1218 are shown to illustrate the direction of a signal transmitted between LEs. Relative to LAB 1206, LABs 1201-1204 are considered fanins, LABs 1205 and 1207 are considered siblings, and LABs 1208 and 1209 are considered fanouts.

Figure 13:
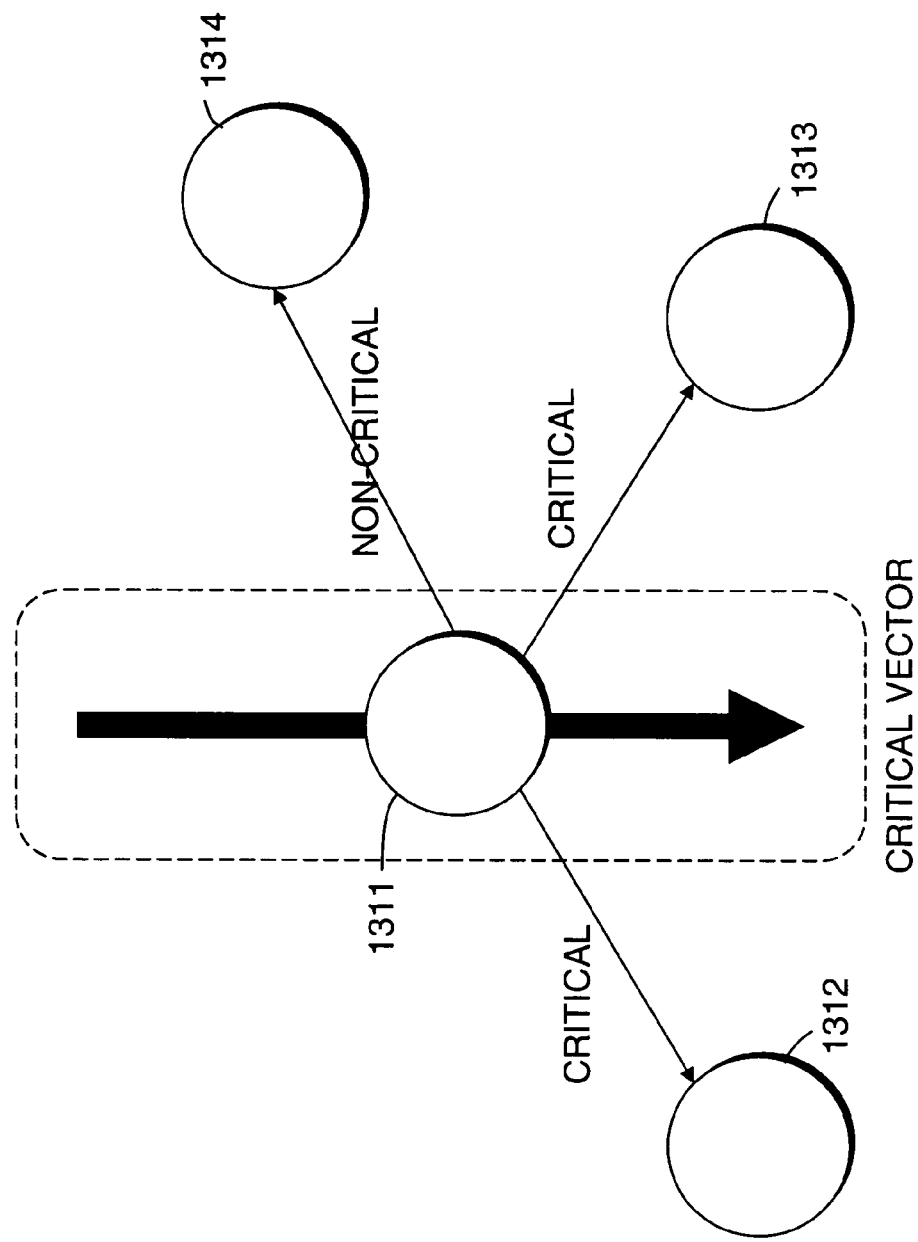
FIG. 13 illustrates an exemplary critical vector move proposal according to an embodiment of the present invention.

Proposed moves may also include move-to-neighbor, move-to-space, and move towards critical vector. A move-to-neighbor involves moving an LE to an adjacent LAB. A move-to-space involves a move to any random free LE location in a target device. A move towards critical vector involves moving an LE towards a vector that is computed by summing the directions of all critical connections associated with the moving LE. FIG. 13 illustrates an exemplary critical vector 1301. Vector 1301 is the critical vector of LE 1311 which has critical connections to LEs 1312 and 1313, and a non-critical connection with LE 1814.

Referring back to FIG. 11, at 1102, a current placement of LEs in a LAB with architectural violations and proposed moves of the LEs in the LAB are evaluated by a cost function. The cost function may include parameters which measure the legality of a LAB (cluster legality cost), timing (timing cost), and an amount of routing resources that is required for a placement (wirelength cost). According to an embodiment of the present invention, the cost function guides the reduction of architectural violations while ensuring minimal disruption. This cost function, C, is illustrated with the relationship shown below.

$$C=K_L*\text{ClusterCost}+K_T*\text{TimingCost}*K_W*\text{WirelengthCost} \quad (2)$$

$K_L$, $K_T$, and $K_W$ represent weighting coefficients that normalize the contributions of each parameter. It should be appreciated that other parameters may be used in addition to or in place of the parameters described.

The cluster legality cost is a cost associated with each LAB $CL_i$. This cost may be represented as shown below.

$$\text{ClusterCost}(CL_i)=kE_i*\text{legality}(CL_i,n_E)+KI_i*\text{legality}(CL_i,n_I)+kR_i*\text{legality}(CL_i,n_R)+kO_i*\text{legality}(CL_i,n_O)+kC_i*\text{legality}(CL_i,n_C) \quad (3)$$

The legality ($CL_i$, . . . ) function returns a measure of legality for a particular constraint. A value of 0 indicates legality, while any positive value is proportional to the amount to which the constraint has been violated. Functions legality ($CL_i$, $n_E$), legality ($CL_i$, $n_I$), legality ($CL_i$, $n_O$), legality ($CL_i$, $n_R$), and legality ($CL_i$, $n_C$) evaluate if LAB $CL_i$ has a feasible number of logic elements, inputs, outputs, reset lines and clock lines, respectively. According to an embodiment of the present invention, the weighting coefficients $kE_i$, $KI_i$, $kO_i$, $kR_i$, and $kC_i$ are all initially set to 1 for every LAB $CL_i$ in the target device.

The timing cost associated with a placement may be represented as shown below.

$$\text{TimingCost}=TC_{VPR}+k_{DAMP}*TC_{DAMP} \quad (4)$$

The first parameter, $TC_{VPR}$, is based upon the cost used by a versatile placement and routing (VPR) placer. This cost may be represented with the following relationship.

$$TC_{VPR}=\Sigma_c\text{crit}(c)*\text{delay}(c) \quad (5)$$

This function encourages critical connections to reduce delay while allowing non-critical connections to optimize wirelength and other optimization criteria.

The second parameter, $TC_{DAMP}$, operates as a damping component of the timing cost function and can be represented with the following relationships.

$$TC_{DAMP}=\Sigma_c\max(\text{delay}(c)-\text{maxdelay}(c),0.0) \quad (6)$$

$$\text{maxdelay}(c)=\text{delay}(c)+\alpha*\text{slack}(c) \quad (7)$$

The damping component penalizes any connection c whose delay(c) exceeds a maximum value maxdelay(c). This allows arbitrary moves to be made along a plateau defined by the maximum delays. The maxdelay values may be updated every time a timing analysis of the system is executed. The maxdelay values are controlled by the slack on the connection considered. The parameter $\alpha$ determines how much of a connection's slack will be allocated to the delay growth of the connection. Thus, the plateau is defined by the connection slack so that connection with large amounts of slack are free to move large distances in order to resolve architectural violations, while small slack values are relatively confined.

Figure 14:
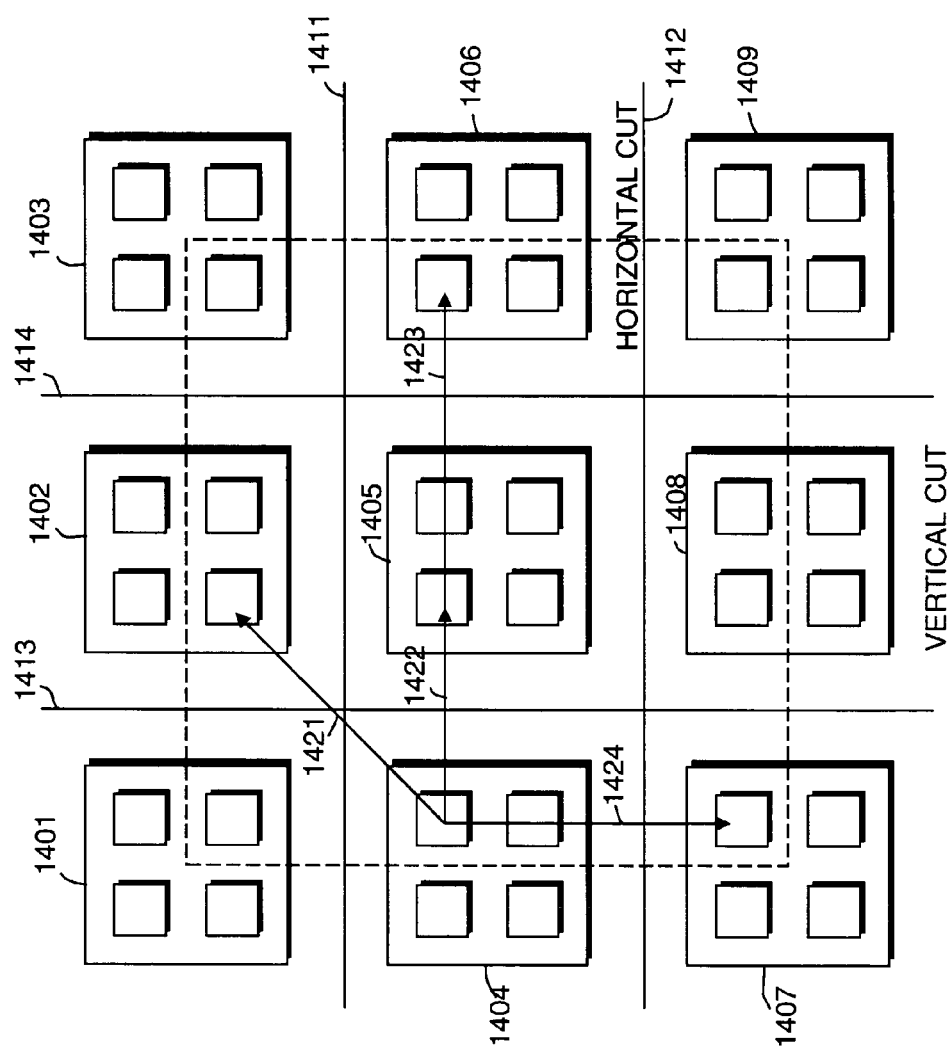
FIG. 14 illustrates horizontal and vertical cut-lines used for local congestion estimation according to an embodiment of the present invention.

Wirelength cost of a placement may be measured by determining a number of routing wires that cross cut-lines that outline a LAB. FIG. 14 illustrates the utilization of cut-lines according to an embodiment of the present invention. Blocks 1401-1409 represent LABs having a plurality of shown LEs. Horizontal cut-lines 1411 and 1412 and vertical cut-lines 1413 and 1414 are placed in each horizontal channel of a target device. Cut-lines provide a method to measure congestion by finding the regions that have the largest number of routing wires 1421-1424. This measurement may be used to prevent the formation of localized congested areas that can cause circuitous routes. The total number of routing wires that intersect a particular cut may be calculated by finding all the signals that intersect a particular cut-line and summing the average crossing-count for each of these signal wires. The average crossing count for a signal may be computed using the following relationship.

$$\text{CrossingCount}(net)=q(\text{NumCLBlockPins}(net)) \quad (8)$$

The function q is given as a number of discrete crossing counts as a function of signal pin count. The argument to the function q is the number of clustered logic block pins used to wire the signal. With respect to the functions shown in (10)-(15), it should be appreciated that other types of functions may be used in addition or in place of the functions represented.

Referring back to FIG. 11, at 1103, it is determined whether the cost associated with any of the proposed moves is better than the cost associated with the current placement. The costs associated with the proposed moves and current placement may be obtained by using cost function values generated from using the cost function described with respect to 1102. If it is determined that the cost associated with any of the proposed moves is better than the cost associated with the current placement, control proceeds to 1104. If it is determined that the cost associated with any of the proposed moves is not better than the cost associated with the current placement, control proceeds to 1105.

At 1104, the proposed move associated with the best cost is selected as the current placement.

At 1105, it is determined whether any additional LABs in the system have architectural violations. If additional LABs in the system have architectural violations, control will move to one of these LABs and proceeds to 1101. If no additional LABs in the system have architectural violations, control proceeds to 1106 and terminates the procedure. According to an embodiment of the present invention, a counter may be used to track the number of proposed moves that have been generated, or the number of LEs or LABs that have had proposed moves generated. In this embodiment, when this number exceeds a threshold value, instead of proceeding to 1101, control terminates the procedure and returns an indication that a fit was not found.

Figure 15:
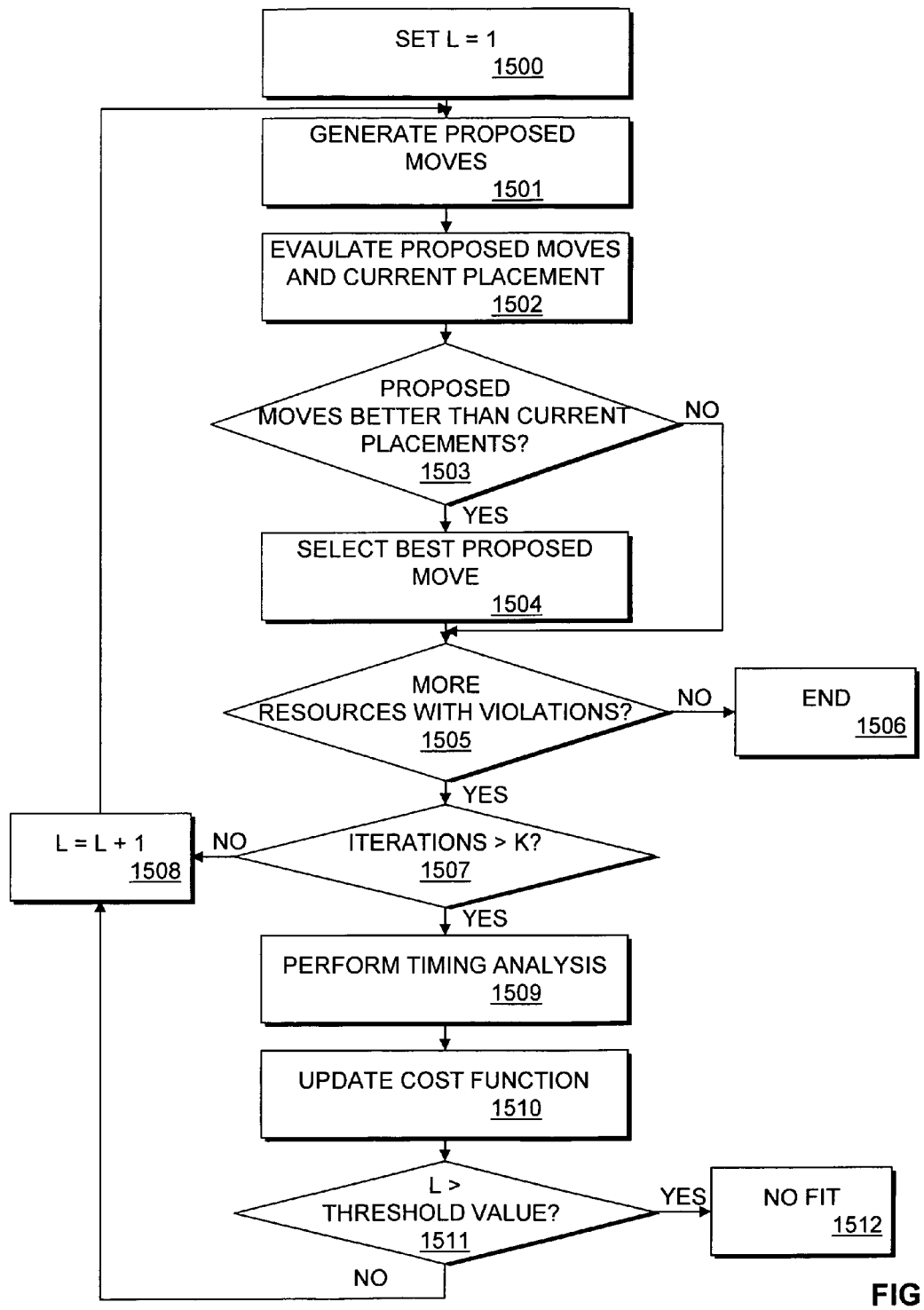
FIG. 15 is a flow chart illustrating a method for performing incremental placement utilizing directed hill-climbing according to an embodiment of the present invention.

FIG. 15 is a flow chart illustrating a method for performing incremental placement utilizing directed hill-climbing according to an embodiment of the present invention. The method described in FIG. 15 may be used to perform incremental placement as shown as 105 in FIG. 1. At 1500, a loop iteration index, L, is set to 1.

At 1501 proposed moves for all LEs in a LAB having architectural violations are generated. According to an embodiment of the present invention, the proposed moves may be generated similarly as described in 1101 shown in FIG. 11. The number of LEs having proposed moves generated is recorded.

At 1502, a current placement of LEs in a LAB with architectural violations and proposed moves of the LEs in the LAB are evaluated by a cost function. According to an embodiment of the present invention, the evaluation performed may be similarly conducted as described in 1102 of FIG. 11.

At 1503, it is determined whether the cost associated with any of the proposed moves is better than the cost associated with the current placement. The costs associated with the proposed moves and current placement may be obtained by using values generated from using the cost function described with respect to 1102. If the cost associated with any of the proposed moves is better than the cost associated with the current placement, control proceeds to 1504. If the cost associated with any of the proposed moves is not better than the cost associated with the current placement, control proceeds to 1505.

At 1504, the proposed move associated with the best cost is selected as the current placement.

At 1505, it is determined whether any additional LABs in the system have architectural violations. If additional LABs in the system have architectural violations, control will move to one of these LABs and proceeds to 1507. If no additional LABs in the system have architectural violations, control proceeds to 1506 and terminates the procedure.

At 1507, it is determined whether the number of LEs that have proposed moves generated exceeds the value K where K is a predefined value. If the number of LEs that have proposed moves generated exceeds the value K, control proceeds to 1509. If the number of LEs that have proposed moves generated does not exceed the value K, control proceeds to 1508.

At 1508, the loop iteration index, L, is incremented. Control returns to 1501.

At 1509, timing analysis is performed. According to an embodiment of the present invention, the values for maxdelay and crit(c), used for evaluating timing cost, are updated to reflect the current configuration of the system.

At 1510, the cost function is updated. According to an embodiment of the present invention, weighting coefficients in the ClusterCost parameter are incremented in proportion to an amount of violation. Updating the cost function allows directed hill-climbing to be performed. Directed hill-climbing is a technique that is used for generating proposed moves when moves cannot be found to decreases the current cost of a placement.

Figure 16:
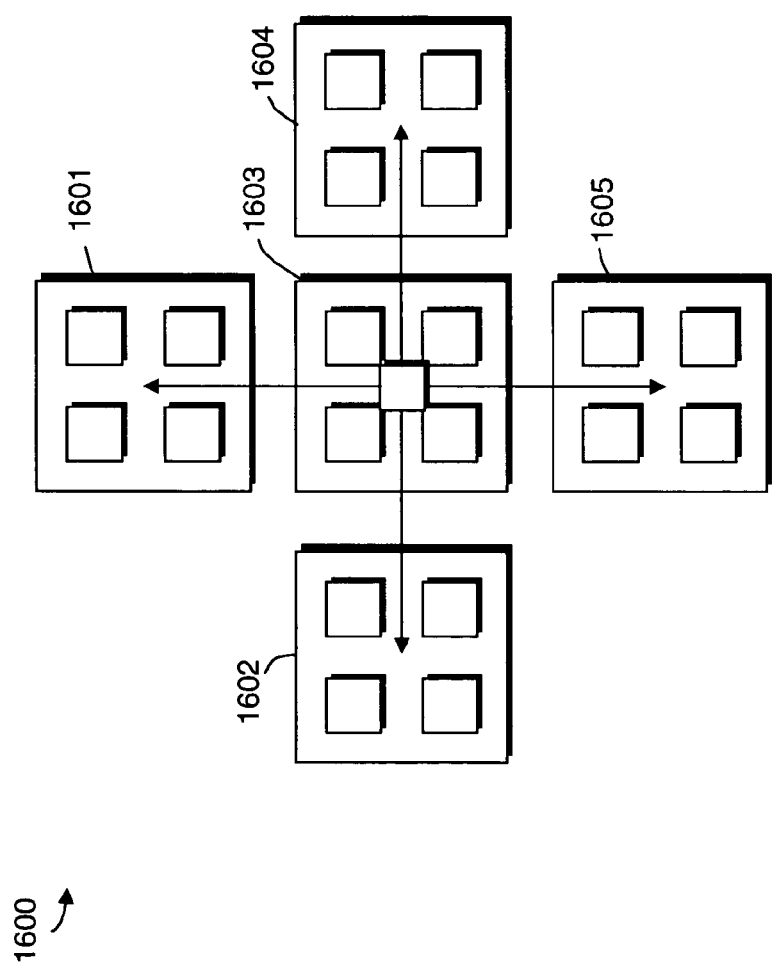
FIG. 16 illustrates a component trapped in a local minima according to an embodiment of the present invention.

FIG. 16 illustrates an example where directed hill-climbing may be applied. The target device 1600 includes a plurality of LABs 1601-1605 each having a plurality of shown LEs. In this example, LAB 1603 has one LE more than is allowed by its architectural specification. Every possible move attempt to resolve the architectural constraints of the center LAB 1603 results in another architectural violation. If all architectural violations are costed in the same manner, then the method described in FIG. 11 may have difficulties resolving the constraint violation.

Figure 17:
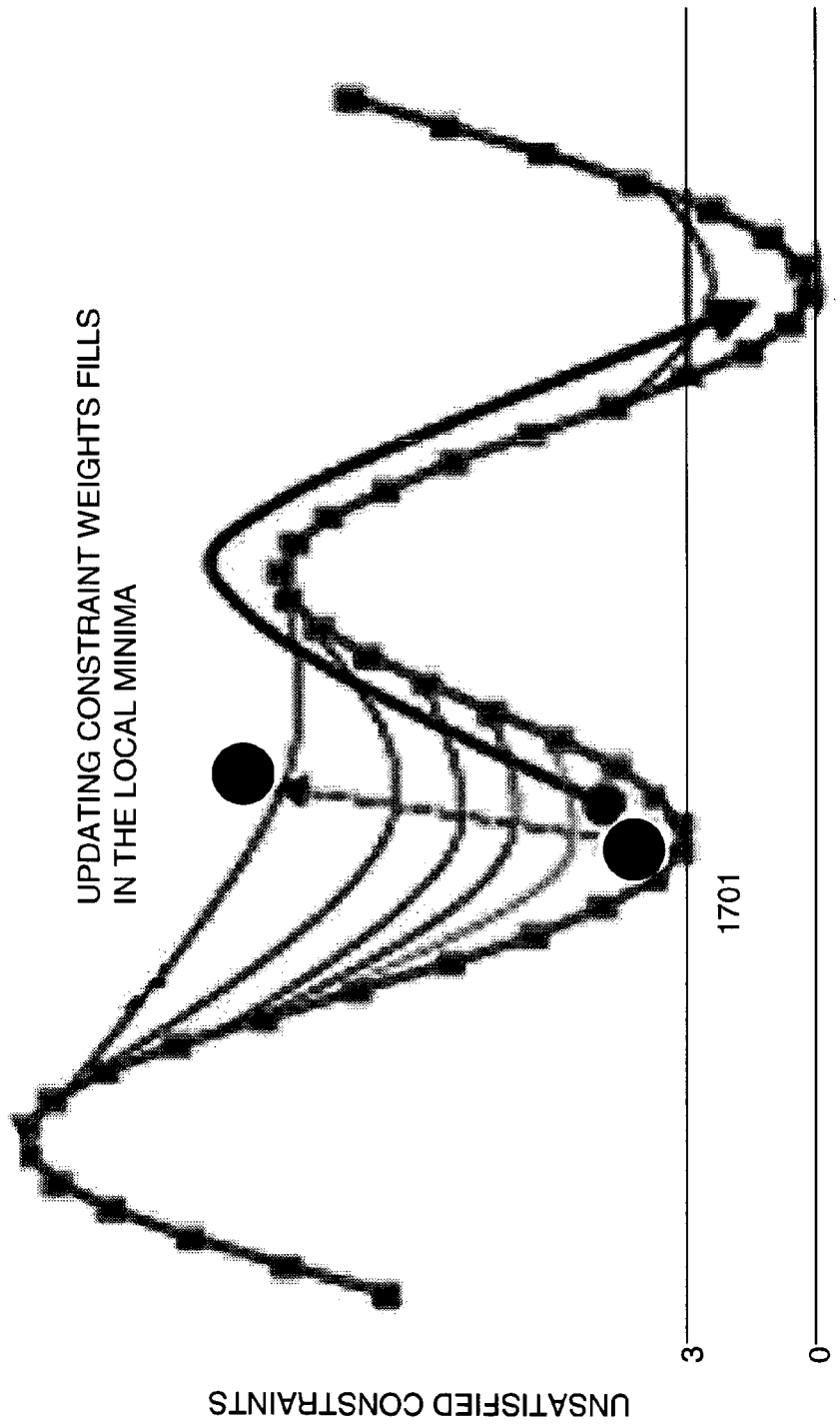
FIG. 17 illustrates basin-filling according to an embodiment of the present invention.

FIG. 17 illustrates a two dimensional slice of the multi-dimensional cost function described. The current state 1701 represents the situation shown in FIG. 16. No single move in the neighborhood of the current state finds a solution with a lower cost. However, the cost function itself could be modified to allow for the current state 1701 to climb the hill. The weighting coefficients of the cost function may be gradually increased for LABs that have unsatisfied constraints. A higher weight may be assigned to unsatisfied constraints that have been violated over a long period of time or over many iterations. This results in the cost function being reshaped to allow for hill climbing. The reshaping of the cost function has the effect of filling a basin where the local minima is trapped. Referring back to FIG. 17, once the weighting coefficients have been increased for LAB 1603, a proposed move to one of the adjacent cluster may be made to allow for shifting the violation "outwards" to a free space.

Updating a cost function also allows for a quick convergence by preventing a phenomenon known as thrashing. Thrashing occurs when incremental placement is trapped in an endless cycle where an LE is moved between two points in the configuration space which both result in architectural violations. By increasing the cost or penalty for moving to the two points, a move to a third point would eventually be more desirable and accepted.

Referring back to FIG. 15, at 1511, it is determined whether the loop index, L, is greater than a threshold value. If the loop index, L, is not greater than the threshold value, control proceeds to 1508. If the loop index, L, is greater than the threshold value, control proceeds to 1512.

At 1512, control terminates the procedure and returns an indication that a fit was not found.

At 106, routing of the system is performed. During routing, routing resources on the target device are allocated to provide interconnections between logic gates, logic elements, and other components on the target device. The routing procedure may be performed by a router in an EDA tool that utilizes routing algorithms.

The incremental placement techniques disclosed allow logic changes to be incorporated into an existing system design without reworking placement of the entire system. The incremental placement techniques attempt to minimize disruption to the original placement and maintain the original timing characteristics. According to an embodiment of the present invention, a method for designing a system on a target device utilizing FPGAs is disclosed. The method includes placing new LEs at preferred locations on a layout of an existing system. Illegalities in placement of the components are resolved. According to one embodiment, resolving the illegalities in placement may be achieved by generating proposed moves for an LE, generating cost function values for a current placement of the LE and for placements associated with the proposed moves, and accepting a proposed move if its associated cost function value is better than the cost function value for the current placement.

FIGS. 1, 4, 11, and 15 are flow charts illustrating embodiments of the present invention. Some of the techniques illustrated in these figures may be performed sequentially, in parallel or in an order other than that which is described. It should be appreciated that not all of the techniques described are required to be performed, that additional techniques may be added, and that some of the illustrated techniques may be substituted with other techniques.

Embodiments of the present invention (e.g. exemplary process described with respect to FIGS. 1, 4, 11, and 15) may be provided as a computer program product, or software, that may include a machine-readable medium having stored thereon instructions. The machine-readable medium may be used to program a computer system or other electronic device. The machine-readable medium may include, but is not limited to, floppy diskettes, optical disks, CD-ROMs, and magneto-optical disks, ROMs, RAMs, EPROMs, EEPROMs, magnetic or optical cards, flash memory, or other type of media/machine-readable medium suitable for storing electronic instructions.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A method for designing a system on a target device utilizing field programmable gate arrays (FPGAs), comprising:
   identifying a first register on a near-critical path having an input connection to an output of a look up table (LUT);
   removing the first register and its input connection to the output of the LUT;
   inserting one or more second registers at one or more inputs of the LUT prior to routing the system;
   inserting inverters at an input and output of the one or more second registers if an output value of the LUT is a logic 1 at startup;
   determining whether removing the first register and inserting the one or more second registers improves timing for the system; and
   undoing the removing and inserting if timing is not improved for the system from the removing and inserting.

2. The method of claim 1, wherein identifying the first register on the near-critical path, comprises:
   determining criticality for paths in the system from slack values generated from a timing analysis; and
   designating a path as being near-critical if its criticality exceeds a threshold value.

3. The method of claim 1, further comprising:
   identifying a third and fourth registers on a near-critical path having output connections to an input of another LUT;
   removing the third and fourth registers and the output connections to the input of the another LUT; and
   inserting a fifth register at an output of the another LUT prior to routing the system.

4. The method of claim 3, further comprising:
   determining whether removing the third and fourth registers and inserting the fifth register improves timing for the system; and
   undoing the removing and inserting if timing is not improved for the system.

5. The method of claim 3, further comprising inserting inverters at an input and output of the fifth register if an output value of the another LUT is a logic 1 at startup.

6. The method of claim 3, further comprising:
   implementing control signal processing for the third and fourth registers with one or more further LUTs such that the third and fourth registers do not need to perform control signal processing.

7. The method of claim 1, further comprising:
   generating a duplicate of another look up table (LUT), the another LUT having an output coupled to an input of a third register receiving a first control signal and an input of a fourth register receiving a second control signal;
   moving the third register backward to one or more inputs of the another LUT if the third register has an input connected to another near-critical path; and
   moving the fourth register backward to one or more inputs of the duplicate of the another LUT if the fourth register has an input connected to the another near-critical path.

8. The method of claim 1, further comprising:
   identifying a first plurality of registers having inputs connected to the near-critical path and outputs of LUTs in a carry chain;
   removing the first plurality of registers from the near-critical path; and
   inserting a second plurality of registers to inputs of the LUTs.

9. The method of claim 1, further comprising:
   identifying a first plurality of registers having outputs connected to the near-critical path and inputs of LUTs in a carry chain;
   removing the first plurality of registers from the near-critical path; and
   inserting a second plurality of registers at the outputs of the LUTs.

10. The method of claim 1, further comprising performing incremental placement to place the one or more second registers.

11. A machine-readable medium having stored thereon sequences of instructions, the sequences of instructions including instructions which, when executed by a processor, causes the processor to perform:
    identifying a first register on a near-critical path of a system on a field programmable gate array (FPGA) having an input connection to an output of a look up table (LUT);
    removing the first register and its input connection to the output of the LUT;
    inserting one or more second registers at one or more inputs of the LUT prior to routing the system;
    inserting inverters at an input and output of the one or more second registers if an output value of the LUT is a logic 1 at startup;
    determining whether removing the first register and inserting the one or more second registers improves timing for the system; and
    undoing the removing and inserting if timing is not improved for the system from the removing and inserting.

12. The machine-readable medium of claim 11, wherein identifying the first registers on the near-critical paths, comprises:
    determining criticality for paths in the system from slack values generated from a timing analysis; and
    designating a path as being near-critical if its criticality exceeds a threshold value.

13. The machine-readable medium of claim 11, further comprising instructions which when executed causes the processor to further perform:
    identifying a third register on another near-critical path having an input connection to an output of another LUT after removing the first register and inserting the one or more second registers;
    removing the third register and its input connection to the output of the another LUT; and
    inserting one or more fourth registers at one or more inputs of the LUT prior to routing the system.

14. The machine-readable medium of claim 13 further comprising instructions which when executed causes the processor to further perform:
    identifying a fifth register on a near-critical path having an output connection to an input of another LUT;
    removing the fifth register and its output connection to the input of the another LUT; and
    inserting a sixth register at an output of the LUT prior to routing the system.

15. The computer-readable medium of claim 11, further comprising instructions which when executed causes the processor to further perform performing incremental placement to place the one or more second registers.

16. The method of claim 11, further comprising instructions which when executed causes the processor to further perform:
determining whether removing the first register and inserting the one or more second registers improves timing for the system; and
undoing the removing and inserting if timing is not improved for the system.

17. A method for designing a system on a target device utilizing field programmable gate arrays (FPGAs), comprising:
identifying a first and second registers on a near-critical path having an output connection to an input of a look-up table (LUT);
removing the first and second registers and its output connection to the input of the LUT;
inserting a third register at an output of the LUT prior to routing the system;
inserting inverters at an input and output of the third register if an output value of the LUT is a logic 1 at startup;
determining whether removing the first and second registers and inserting the third register improves timing for the system; and
undoing the removing and inserting if timing is not improved for the system from the removing and inserting.

18. The method of claim 17, further comprising:
identifying a fourth register on the near-critical path having an input connection to an output of a second LUT;
removing the fourth register and its input connection to the output of the second LUT; and
inserting a fifth register at an input of the LUT prior to routing the system.

19. The method of claim 18, further comprising:
determining whether removing the fourth register and inserting the fifth register improves timing for the system;
undoing the removing and inserting if timing is not improved for the system.

20. The method of claim 17, further comprising:
generating a duplicate of another look up table (LUT) having an output coupled to an input of a fourth register receiving a first control signal and an input of a fifth register receiving a second control signal;
moving the fourth register backward to one or more inputs of the LUT if the fourth register has an input connected to another near-critical path; and
moving the fifth register backward to one or more inputs of the duplicate of the another LUT if the fifth register has an input connected to the another near-critical path.

21. The method of claim 17, further comprising:
identifying a first plurality of registers having inputs connected to the near-critical path and outputs of LUTs in a carry chain;
removing the first plurality of registers from the near-critical path; and
inserting a second plurality of registers to inputs of the LUTs.

22. The method of claim 17, further comprising:
identifying a first plurality of registers having outputs connected to the near-critical path and inputs of LUTs in a carry chain;
removing the first plurality of registers from the near-critical path; and
inserting a second plurality of registers at the outputs of the LUTs.

23. The method of claim 17, further comprising performing incremental placement to place the second register.

24. The method of claim 17, further comprising:
saving the third register in a design for the system if timing is improved for the system.

25. A method for designing a system on a target device utilizing field programmable gate arrays (FPGAs), comprising:
identifying a first and second registers on a near-critical path having an output connection to an input of a look-up table (LUT);
removing the first and second registers and its output connection to the input of the LUT;
implementing control signal processing for the first and second registers with one or more further LUTs such that the first and second registers do not need to perform control signal processing;
determining whether removing the first and second registers and inserting the third register improves timing for the system; and
undoing the removing, inserting, and implementing if timing is not improved for the system from the removing, inserting, and implementing.

26. The method of claim 25, further comprising:
identifying a fourth register on the near-critical path having an input connection to an output of a second LUT;
removing the fourth register and its input connection to the output of the second LUT; and
inserting a fifth register at an input of the LUT prior to routing the system.

27. The method of claim 26, further comprising:
determining whether removing the fourth register and inserting the fifth register improves timing for the system;
undoing the removing and inserting if timing is not improved for the system.

28. The method of claim 25, further comprising:
generating a duplicate of another look up table (LUT) having an output coupled to an input of a fourth register receiving a first control signal and an input of a fifth register receiving a second control signal;
moving the fourth register backward to one or more inputs of the LUT if the fourth, register has an input connected to another near-critical path; and
moving the fifth register backward to one or more inputs of the duplicate of the another LUT if the fifth register has an input connected to the another near-critical path.

29. The method of claim 25, further comprising:
identifying a first plurality of registers having inputs connected to the near-critical path and outputs of LUTs in a carry chain;
removing the first plurality of registers from the near-critical path; and
inserting a second plurality of registers to inputs of the LUTs.

30. The method of claim 25, further comprising:

identifying a first plurality of registers having outputs connected to the near-critical path and inputs of LUTs in a carry chain;

removing the first plurality of registers from the near-critical path; and inserting a second plurality of registers at the outputs of the LUTs.

31. A method for designing a system on a target device utilizing field programmable gate arrays (FPGAs), comprising:

identifying a first register on a near-critical path having an input connection to an output of a look up table (LUT);

removing the first register and its input connection to the output of the LUT;

inserting one or more second registers at one or more inputs of the LUT prior to routing the system;

implementing control signal processing for one or more second registers with one or more further LUTs such that the first and second registers do not need to perform control signal processing;

determining whether removing the first register and inserting the one or more second registers improves timing for the system; and undoing the removing, inserting, and implementing if timing is not improved for the system from the removing and inserting.

\* \* \* \* \*